(12) United States Patent
Kim et al.

(10) Patent No.: US 11,579,715 B2
(45) Date of Patent: *Feb. 14, 2023

(54) FLEXIBLE ORGANIC LIGHT EMITTING DISPLAY DEVICE AND METHOD OF MANUFACTURING THE SAME

(71) Applicant: SAMSUNG DISPLAY CO., LTD., Yongin-si (KR)

(72) Inventors: Hyunchul Kim, Hwaseong-si (KR); Seongjun Lee, Seoul (KR); Seongryong Lee, Hwaseong-si (KR); Wonsuk Choi, Seoul (KR); Yoonsun Choi, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/157,386

(22) Filed: Jan. 25, 2021

(65) Prior Publication Data

US 2021/0141480 A1    May 13, 2021

Related U.S. Application Data

(63) Continuation of application No. 16/026,975, filed on Jul. 3, 2018, now Pat. No. 10,901,542.

(30) Foreign Application Priority Data

Jul. 10, 2017  (KR) .......................... 10-2017-0086934

(51) Int. Cl.
*G06F 3/041* (2006.01)
*H01L 27/32* (2006.01)
(Continued)

(52) U.S. Cl.
CPC .......... *G06F 3/0412* (2013.01); *G02B 5/3025* (2013.01); *G06F 3/047* (2013.01);
(Continued)

(58) Field of Classification Search
None
See application file for complete search history.

(56) References Cited

U.S. PATENT DOCUMENTS 9,326,375 B2   4/2016  Lee
9,516,743 B2  12/2016  Kim et al.
(Continued)

FOREIGN PATENT DOCUMENTS

JP      2003-330387     11/2003
KR    1020150079206      7/2015
(Continued)

OTHER PUBLICATIONS

Fei Liu, et al., "Negative Capacitance Transistors with Monolayer Black Phosphorous," npj Quantum Materials 1, Article No. 16004 (2016).

*Primary Examiner* — Brian M Butcher
(74) *Attorney, Agent, or Firm* — F. Chau & Associates, LLC

(57) ABSTRACT

An OLED device includes a substrate having a display region including a pixel region and first and second peripheral regions surrounding the pixel region. A bending region is between the display region and the second peripheral region. A buffer layer has a first opening exposing an upper surface of the substrate. A plurality of pixel structures is disposed in the pixel region on the buffer layer. An insulation layer structure is disposed on the buffer layer. The insulation layer structure has a second opening exposing an upper surface of the substrate that is disposed in the bending region and a first portion of the buffer layer that is disposed adjacent (Continued)

to the bending region. A fan-out wiring is disposed between two adjacent insulation layers of the plurality of insulation layers. The fan-out wiring is disposed in the first peripheral region and/or the second peripheral region.

16 Claims, 25 Drawing Sheets

(51) Int. Cl.
*H01L 51/00* (2006.01)
*H01L 51/56* (2006.01)
*H01L 51/52* (2006.01)
*G02B 5/30* (2006.01)
*G06F 3/047* (2006.01)

(52) U.S. Cl.
CPC ........ *H01L 27/322* (2013.01); *H01L 27/3246* (2013.01); *H01L 27/3258* (2013.01); *H01L 27/3276* (2013.01); *H01L 51/0097* (2013.01); *H01L 51/5203* (2013.01); *H01L 51/5237* (2013.01); *H01L 51/56* (2013.01); *H01L 27/323* (2013.01)

(56) References Cited

U.S. PATENT DOCUMENTS

| 10,686,025 | B2 | 1/2020 | Oh |
| 10,901,542 | B2 * | 1/2021 | Kim ........................ G02B 5/305 |
| 2014/0138637 | A1 | 6/2014 | Yang et al. |
| 2014/0217373 | A1 | 8/2014 | Youn et al. |
| 2014/0232956 | A1 | 8/2014 | Kwon et al. |
| 2016/0041667 | A1 | 2/2016 | Lai et al. |
| 2017/0025492 | A1 | 1/2017 | Jung et al. |
| 2017/0040406 | A1 | 2/2017 | Park et al. |
| 2017/0062760 | A1 | 3/2017 | Kim |
| 2017/0075464 | A1 | 3/2017 | Ahn |
| 2017/0090651 | A1 | 3/2017 | Kang et al. |
| 2019/0012031 | A1 | 1/2019 | Kim et al. |

FOREIGN PATENT DOCUMENTS

| KR | 1020170019546 | 2/2017 |
| KR | 1020170024200 | 3/2017 |
| KR | 1020170032955 | 3/2017 |
| KR | 1020170035064 | 3/2017 |
| KR | 10-2017-0051680 | 5/2017 |

* cited by examiner

FIG. 10
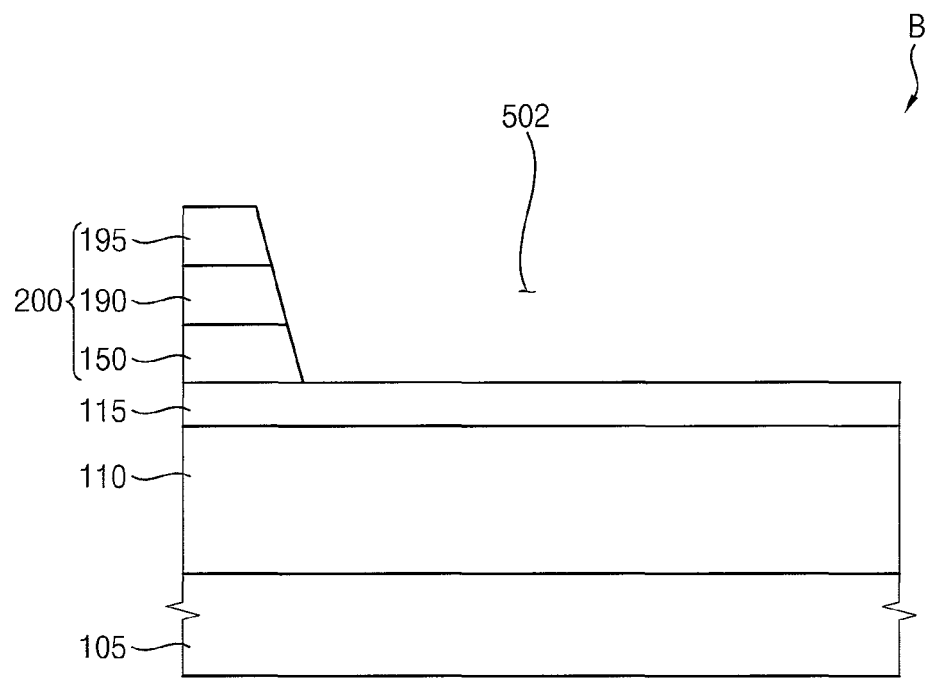
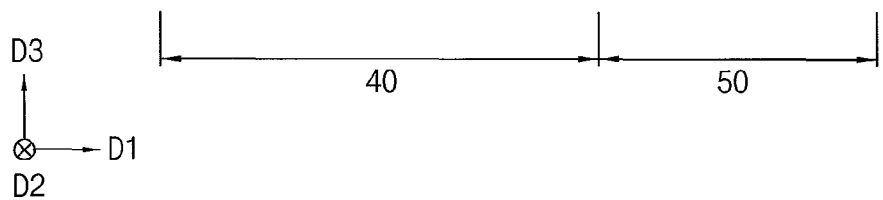

FLEXIBLE ORGANIC LIGHT EMITTING DISPLAY DEVICE AND METHOD OF MANUFACTURING THE SAME

CROSS-REFERENCE TO RELATED APPLICATION(S)

This application is a Continuation of co-pending U.S. patent application Ser. No. 16/026,975, filed on Jul. 3, 2018, which claims priority under 35 USC § 119 to Korean Patent Applications No. 10-2017-0086934, filed on Jul. 10, 2017 in the Korean Intellectual Property Office (KIPO), the contents of which are incorporated by reference, herein in their entirety.

TECHNICAL FIELD

The present disclosure relates generally to organic light emitting display devices, and more specifically, to flexible organic light emitting display devices and a method of manufacturing the flexible organic light emitting display device.

DISCUSSION OF THE RELATED ART

Portable electronic devices often make use of flat panel display (FPD) devices because the FPD device is lightweight and thin as compared to a cathode-ray tube (CRT) display device. Typical examples of the FPD device are a liquid crystal display (LCD) device and an organic light emitting display (OLED) device.

Recently, FPDs such as OLEDs have been made flexible. Such devices may be capable of bending or folding. These flexible OLED devices may include lower and upper substrates, which are made of flexible materials. For example, the lower substrate included in the display panel may be formed of a flexible substrate, and the upper substrate included in the display panel may have a thin film encapsulation structure. Here, to increase bendability along a particular bending section, a mask process may be used to remove inorganic insulation layers disposed in the bending section. In this case, as the number of mask processes increase, a manufacturing cost of the OLED device may be raised.

SUMMARY

An organic light emitting display (OLED) device includes a substrate having a display region including a pixel region and a first peripheral region surrounding the pixel region. The substrate further includes a second peripheral region that is spaced apart from the display region. A bending region is interposed between the display region and the second peripheral region. A buffer layer is disposed on the substrate. The buffer layer has a first opening exposing an upper surface of the substrate that is disposed in the bending region. A plurality of pixel structures is disposed in the pixel region on the buffer layer. An insulation layer structure including a plurality of insulation layers is disposed on the buffer layer. The insulation layer structure has a second opening exposing an upper surface of the substrate that is disposed in the bending region and a first portion of the buffer layer that is disposed adjacent to the bending region. A fan-out wiring is disposed between two adjacent insulation layers of the plurality of insulation layers. The fan-out wiring is disposed in the first peripheral region and/or the second peripheral region. A first planarization layer is disposed on the insulation structure, that is disposed adjacent to the bending region, and the substrate that is disposed in the bending region. A connection electrode is disposed in the bending region on the first planarization layer. The connection electrode is electrically connected to the fan-out wiring. The connection electrode electrically connects the pixel structure and an external device.

A method of manufacturing an OLED device includes providing a substrate having a display region including a pixel region and a first peripheral region surrounding the pixel region. A second peripheral region is spaced apart from the display region. A bending region is interposed between the display region and the second peripheral region. A buffer layer is formed on the substrate. A semiconductor element, a fan-out wiring, and an insulation layer structure are formed on the buffer layer such that a first opening exposes an upper surface of the substrate that is disposed in the bending region, and a second opening exposes a first portion of the buffer layer that is disposed adjacent to the bending region. A first planarization layer is formed on the insulation layer structure that is disposed adjacent in the bending region and the substrate that is disposed in the bending region. A connection electrode is formed in the bending region on the first planarization layer substrate such that the connection electrode is electrically connected to the fan-out wiring. Pixel structures are formed on the semiconductor element.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein:

FIGS. 6, 7, 8, 9, 10, 11, 12, 13, 14, 15, 16, 17, 18, and 19 are cross-sectional views illustrating a method of manufacturing an OLED device in accordance with exemplary embodiments of the present invention;

DETAILED DESCRIPTION OF THE EMBODIMENTS

Figure 1:
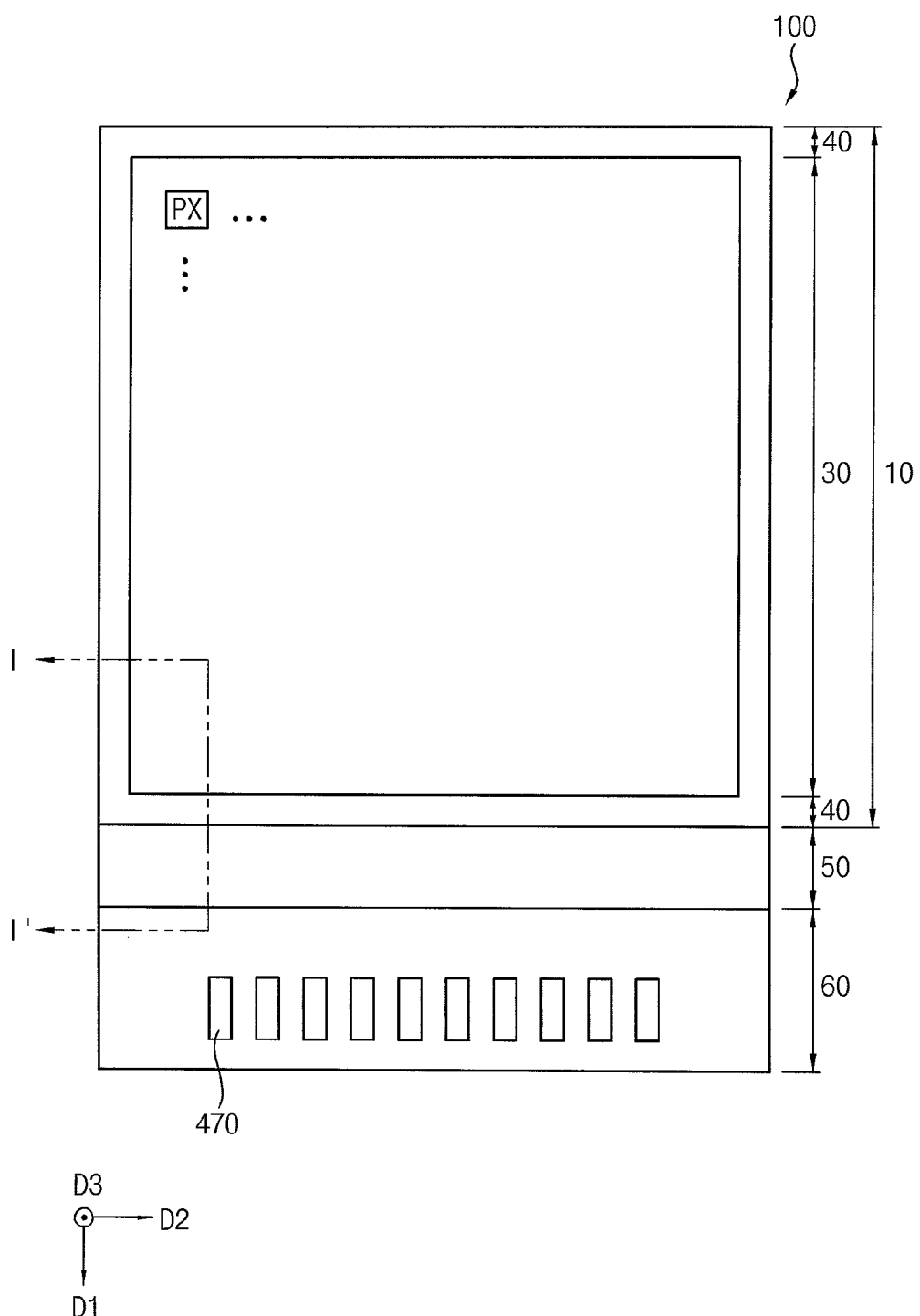
FIG. 1 is a plan view illustrating an organic light emitting display (OLED) device in accordance with exemplary embodiments of the present invention.

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

Figure 2:
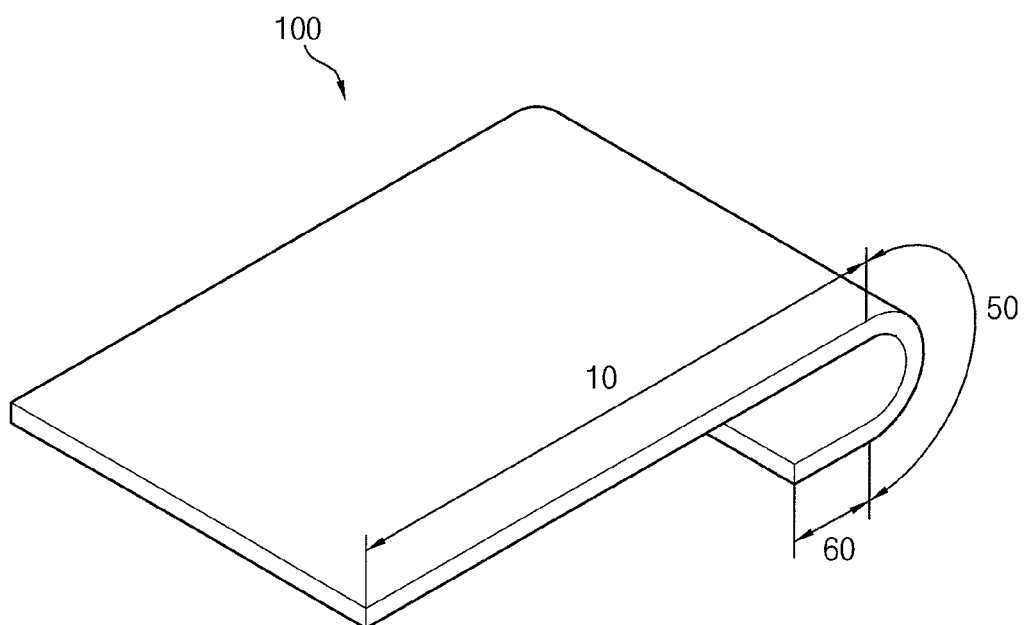
FIG. 2 is a perspective view illustrating a bent shape of the OLED device of FIG. 1.
Figure 3:
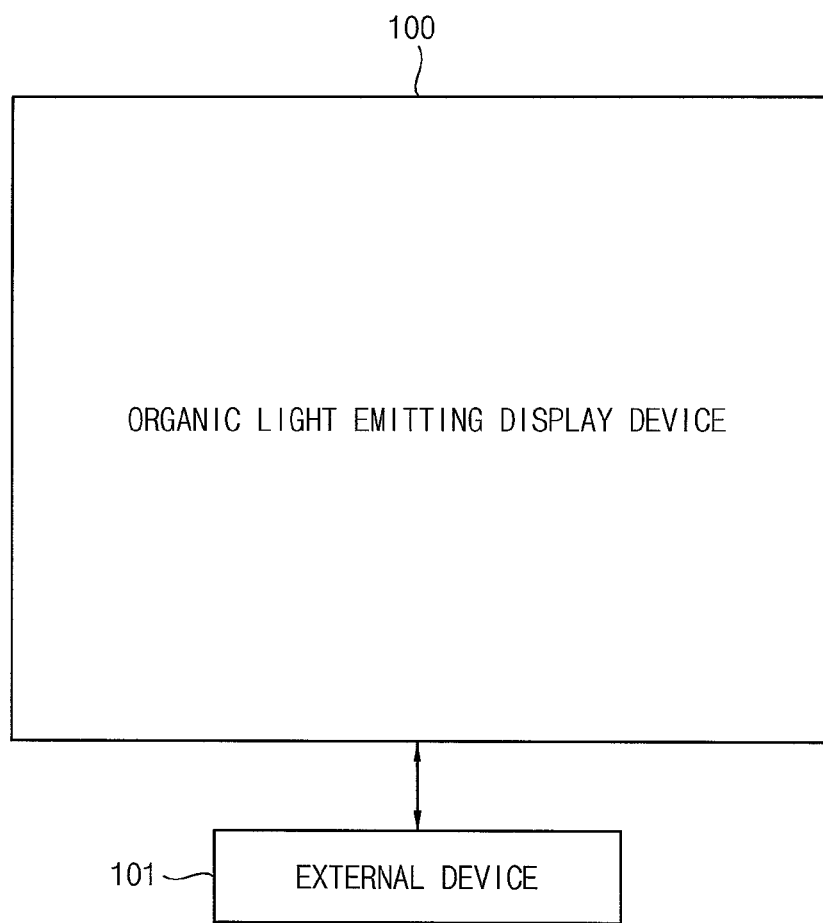
FIG. 3 is a block diagram illustrating an external device electrically connected to the OLED device of FIG. 1.

FIG. 1 is a plan view illustrating an organic light emitting display (OLED) device in accordance with exemplary embodiments of the present invention, and FIG. 2 is a perspective view illustrating a bent shape of the OLED device of FIG. 1. FIG. 3 is a block diagram illustrating an external device electrically connected to the OLED device of FIG. 1.

Referring to FIGS. 1, 2, and 3, an OLED device 100 may have a display region 10, which has a pixel region 30 and a first peripheral region 40 surrounding the pixel region 30, a bending region 50, and a second peripheral region 60. A plurality of pixels PX may be disposed in the display region 10. The second peripheral region 60 may be spaced apart from the display region 10. Pad electrodes 470, that are electrically connected to an external device 101, may be disposed in the second peripheral region 60. The bending region 50 may be interposed between the display region 10 and the second peripheral region 60.

According to exemplary embodiments of the present invention, the pixels PX (e.g., a pixel structure) emitting a light may be disposed in the pixel region 30, and a plurality of wirings may be disposed in the first peripheral region 40. The wirings may electrically connect the pad electrodes 470 and the pixels PX. For example, the wirings may include data signal wirings, scan signal wirings, light emission signal wirings, power supply voltage wirings, touch screen wirings, etc. In addition, a scan driver, a data driver, etc. may be disposed in the first peripheral region 40. Further, a portion of the first peripheral region 40 may be interposed between the pixel region 30 and the bending region 50.

According to exemplary embodiments of the present invention, a width of the first peripheral region 40 surrounding the pixel region 30 of FIG. 1 may be constant, but the present invention is not limited to this particular configuration. For example, the first peripheral region 40 may include a first region extending in a first direction D1 that corresponds to a row direction in a plan view of the OLED device 100 and a second region extending in a second direction D2 that corresponds to a column direction in a plan view of the OLED device 100. For example, the first region of the first peripheral region 40 may be disposed in both lateral portions of the pixel region 30, and the second region of the first peripheral region 40 may be disposed adjacent to the top of the pixel region 30 and the bending region 50. Here, a width extending in the second direction D2 of the first region may be smaller than a width extending in the first direction D1 of the second region. Alternatively, widths extending in the second direction D2 of the bending region 50 and the second peripheral region 60 each may be smaller than a width extending in the second direction D2 of the display region 10.

As illustrated in FIG. 2, as the bending region 50 is bent on an axis with respect to the second direction D2, the second peripheral region 60 may be disposed on a lower surface of the OLED device 100. For example, when the second peripheral region 60 is disposed on the lower surface of the OLED device 100, the bending region 50 may have a round shape (or a bended shape). According to exemplary embodiments of the present invention, the OLED device 100 may further include connection electrodes. The connection electrodes may be disposed overlapping the bending region 50, and may electrically connect the wiring and the pad electrodes 470. As illustrated in FIG. 3, the pixels PX that are disposed in the pixel region 30 may be electrically connected to the external device 101 that is electrically connected to the pad electrodes 470 through the connection electrodes that are disposed in the bending region 50 and a plurality of wirings that are disposed in the first peripheral region 40. For example, the external device 101 may be electrically connected to the OLED device 100 through a flexible printed circuit board (FPCB). The external device 101 may provide a data signal, a scan signal, a light emission signal, a power supply voltage, a touch screen driving signal, etc. to the OLED device 100. In addition, a driving integrated circuit may be mounted (e.g., installed) in the FPCB. In some exemplary embodiments of the present disclosure, the driving integrated circuit may be mounted in the OLED device 100 that is disposed adjacent to the pad electrodes 470.

Figure 4:
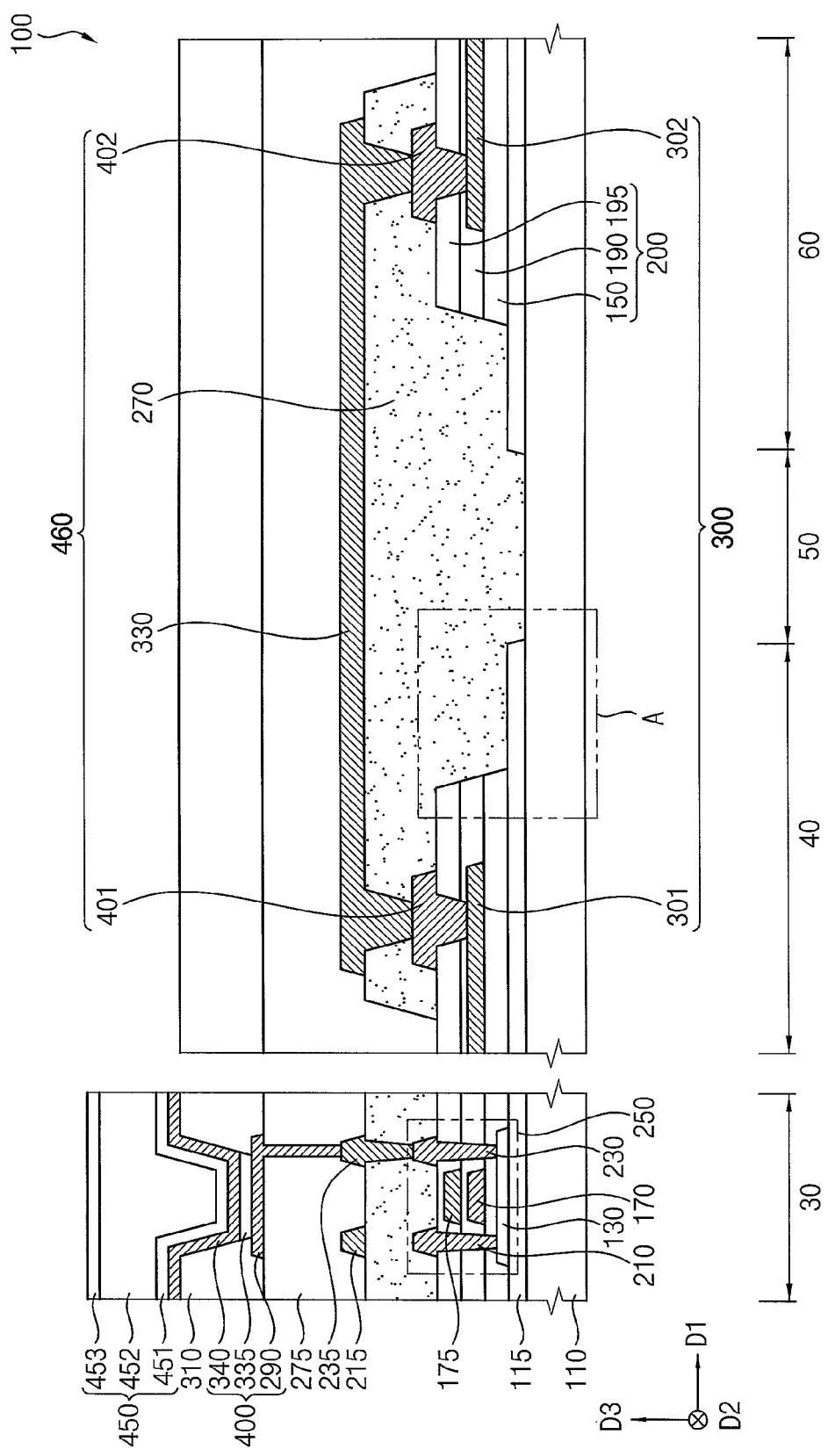
FIG. 4 is a cross-sectional view taken along a line I-I' of FIG. 1.
Figure 5:
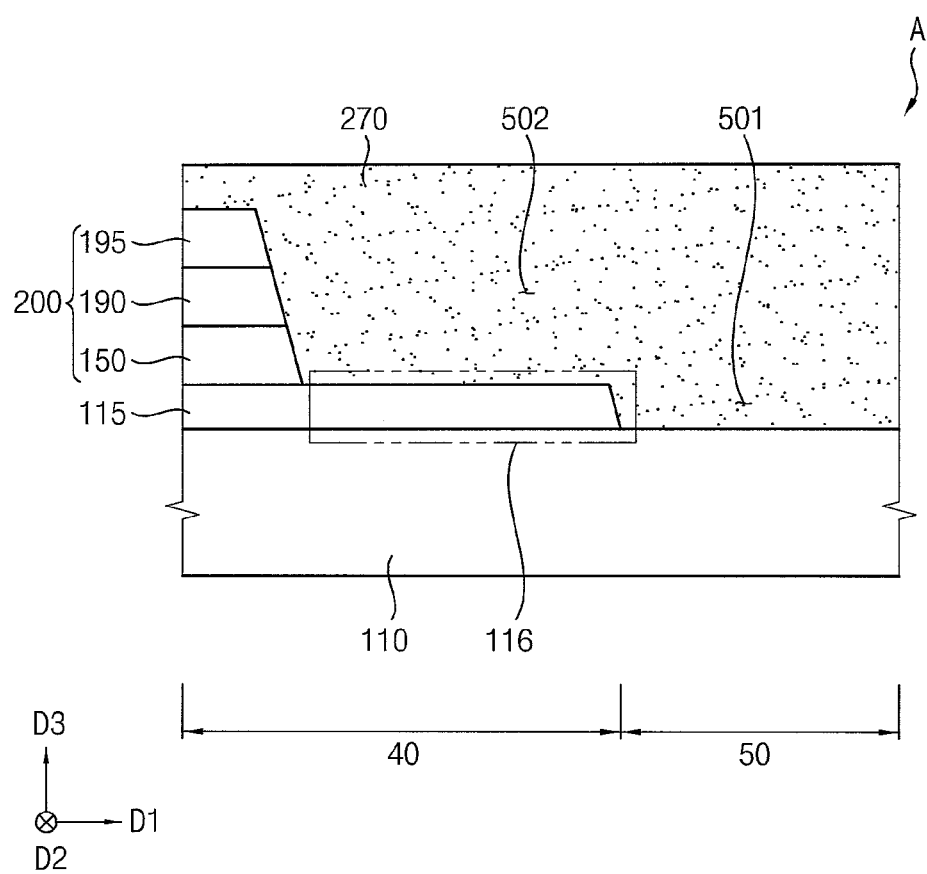
FIG. 5 is an enlarged cross-sectional view corresponding to region 'A' of FIG. 3.

FIG. 4 is a cross-sectional view taken along a line I-I' of FIG. 1, and FIG. 5 is an enlarged cross-sectional view corresponding to region 'A' of FIG. 4.

Referring to FIGS. 3 and 4, an OLED device 100 may include a substrate 110, a buffer layer 115, an insulation layer structure 200, a semiconductor element 250, a pixel structure 400, a fan-out wiring 300, a conductive pattern 460, a first planarization layer 270, a second planarization layer 275, a connection electrode 330, a wiring pattern 215, a connection pattern 235, a pixel defining layer 310, a thin film encapsulation (TFE) structure 450, etc. Here, the substrate 110 may have a pixel region 30, a first peripheral region 40 (e.g., the first peripheral region 40 disposed between the pixel region 30 and a bending region 50), a bending region 50, and a second peripheral region 60 (refer to FIG. 1). The insulation layer structure 200 may include a first gate insulation layer 150, a second gate insulation layer 190, and an insulating interlayer 195. The semiconductor element 250 may include an active layer 130, a first gate electrode 170, a second gate electrode 175, a source electrode 210, and a drain electrode 230. In addition, the conductive pattern 460 may include a first conductive pattern 401 and a second conductive pattern 402. The fan-out wiring 300 may include a first fan-out wiring 301 and a second fan-out wiring 302. Further, the pixel structure 400 may include a lower electrode 290, a light emitting layer 335, and an upper electrode 340. The TFE structure 450 may include a first TFE layer 451, a second TFE layer 452, and a third TFE layer 453.

As described above, as the OLED device 100 includes the substrate 110 and the flexible TFE structure 450 that is bent in the bending region 50 on an axis along a second direction D2. The OLED device 100 may serve as a flexible OLED device having a shape in which the bending region 50 is bent.

The substrate 110 may include transparent or opaque insulation materials. The substrate 110 may include a flexible transparent resin substrate. According to exemplary embodiments of the present invention, the substrate 110 may have a configuration where the first organic layer, the first barrier layer, the second organic layer, and the second barrier layer are sequentially stacked. The first barrier layer and the second barrier layer each may include inorganic materials, and the first organic layer and the second organic layer each may include organic materials. For example, each of the first and second barrier layers and may include silicon oxide, and may block moisture or water that is permeated through the first and second organic layers. Further, each of the first and second organic layers 111 and 113 may include a polyimide-based resin.

Since the substrate 110 is relatively thin and flexible, the substrate 110 may be disposed on a rigid glass substrate to help support the formation of the semiconductor element 250 and the pixel structure 400. In a manufacturing the OLED device 100, after the buffer layer 115 is provided on the second barrier layer of the substrate 110, the semiconductor element 250 and the pixel structure 400 may be disposed on the buffer layer 115. After the semiconductor element 250 and the pixel structure 400 are formed on the buffer layer 115, the rigid glass substrate, on which the substrate 110 is disposed, may be removed. For example, as it may be difficult to directly form the semiconductor element 250 and the pixel structure 400 on the substrate 110 because the substrate 110 is relatively thin and flexible, the semiconductor element 250 and the pixel structure 400 may be formed on the substrate 110 and the rigid glass substrate, and then the substrate 110 including the first organic layer, the first barrier layer, the second organic layer, and the second barrier layer may serve as the substrate 110 of the OLED device 100 after the removal of the rigid glass substrate. Alternatively, the substrate 110 may include a quartz substrate, a synthetic quartz substrate, a calcium fluoride substrate, a fluoride-doped quartz substrate, a sodalime glass substrate, a non-alkali glass substrate etc.

According to exemplary embodiments of the present invention, the substrate 110 includes four-layers. However, the substrate 110 may alternatively include a different number of layers. For example, in some exemplary embodiments of the present invention, the substrate 110 may include a single layer or a plurality of layers.

The buffer layer 115 may be disposed on the substrate 110. According to exemplary embodiments of the present invention, the buffer layer 115 may be entirely disposed in the pixel region 30, the first peripheral region 40, and the second peripheral region 60 on the substrate 110, and may have a first opening 501 exposing an upper surface of the substrate 110 that is located within the bending region 50 (refer to FIG. 5). For example, a first portion 116 of the buffer layer 115 may be disposed in the first and second peripheral regions 40 and 60 that are disposed adjacent to the bending region 50, and may protrude from side walls of the insulation layer structure 200. In addition, a second portion of the buffer layer 115 may be disposed in the first and second peripheral regions 40 and 60, and may overlap the insulation layer structure 200.

The buffer layer 115 may prevent the diffusion of metal atoms and/or impurities from the substrate 110 into the semiconductor element 250. In addition, the buffer layer 115 may control a rate of a heat transfer in a crystallization process for forming the active layer 130, thereby obtaining substantially uniform active layer. Further, the buffer layer 115 may increase a surface flatness of the substrate 110 when a surface of the substrate 110 is relatively irregular. In some exemplary embodiments of the present invention, according to a type of the substrate 110, at least two buffer layers 115 may be disposed on the substrate 110, or the buffer layer might not be disposed. The buffer layer 115 may include silicon compound, metal oxide, etc. For example, the buffer layer 115 may include silicon oxide (SiOx), silicon nitride (SiNx), silicon oxynitride (SiOxNy), silicon oxycarbide (SiOxCy), silicon carbon nitride (SiCxNy), aluminum oxide (AlOx), aluminum nitride (AlNx), tantalum oxide (TaOx), hafnium oxide (HfOx), zirconium oxide (ZrOx), titanium oxide (TiOx), and/or etc.

The active layer 130 may be disposed in the pixel region 30 on the buffer layer 115. The active layer 130 may include an oxide semiconductor, an inorganic semiconductor (e.g., amorphous silicon, polysilicon, etc.), an organic semiconductor, etc.

The first gate insulation layer 150 may be disposed on the active layer 130. The first gate insulation layer 150 may cover at least a portion of the active layer 130 in the pixel region 30 on the buffer layer 115, and may extend substantially in a first direction D1 from the pixel region 30 into the second peripheral region 60. For example, the first gate insulation layer 150 may at least partially cover the active layer 130 on the buffer layer 115, and may have a substantially level surface without a step around the active layer 130. Alternatively, the first gate insulation layer 150 may cover at least a portion of the active layer 130 on the buffer layer 115, and may be disposed with a substantially uniform thickness along a profile of the active layer 130. According to exemplary embodiments of the present invention, the first gate insulation layer 150 may be disposed in the pixel region 30, the first peripheral region 40, and the second peripheral region 60 on the buffer layer 115, and may have an opening exposing the upper surface of the substrate 110 that is disposed in the bending region 50. The first portion 116 of the buffer layer 115 may be disposed in the peripheral region 40 that is disposed adjacent to the bending region 50. The first gate insulation layer 150 may include silicon compound, metal oxide, etc.

The first gate electrode 170 may be disposed on a portion of the first gate insulation layer 150 under which the active layer 130 is disposed. The first gate electrode 170 may include a metal, a metal alloy, metal nitride, conductive metal oxide, transparent conductive materials, etc. These may be used alone or in a suitable combination thereof. In some exemplary embodiments of the present invention, the first gate electrode 170 may have a multi-layered structure.

The fan-out wiring 300 may be disposed in the first and second peripheral regions 40 and 60 that are disposed adjacent to the bending region 50 on the first gate insulation layer 150, and might not be disposed on the upper surface of the substrate 110 located in the bending region 50 and the first portion 116 of the buffer layer 115 such that the upper surface of the substrate 110 disposed in the bending region 50 and the first portion 116 of the buffer layer 115 are exposed. According to exemplary embodiments of the present invention, the fan-out wiring 300 may include the first fan-out wiring 301 and the second fan-out wiring 302. The first fan-out wiring 301 may extend substantially along the first direction D1 in the first peripheral region 40 on the first gate insulation layer 150, and may electrically connected to the pixel structure 400 that is disposed in the pixel region 30. In addition, the second fan-out wiring 302 may extend substantially along the first direction D1 in the second peripheral region 60 on the first gate insulation layer 150, and may be electrically connected to an external device 101 through pad electrodes 470 that are disposed in the second peripheral region 60 (refer to FIG. 1).

The fan-out wiring 300 may include a metal, a metal alloy, metal nitride, conductive metal oxide, transparent conductive materials, etc. According to exemplary embodiments of the present invention, the fan-out wiring 300 and the first gate electrode 170 may be disposed at the same level (or the same layer), and may be simultaneously (or concurrently) formed using the same material. For example, the fan-out wiring 300 may include gold (Au), silver (Ag), aluminum (Al), platinum (Pt), nickel (Ni), titanium (Ti), palladium (Pd), magnesium (Mg), Calcium (Ca), Lithium (Li), chromium (Cr), tantalum (Ta), tungsten (W), copper (Cu), molybdenum (Mo), scandium (Sc), neodymium (Nd), Iridium (Ir), an alloy of aluminum, aluminum nitride (AlNx), an alloy of silver, tungsten nitride (WNx), an alloy of copper, an alloy of molybdenum, titanium nitride (TiNx), chromium nitride (CrNx), tantalum nitride (TaNx), strontium ruthenium oxide (SRO), zinc oxide (ZnOx), indium tin oxide (ITO), stannum oxide (SnOx), indium oxide (InOx), gallium oxide (GaOx), indium zinc oxide (IZO), and/or etc. These may be used alone or in a suitable combination thereof. In some exemplary embodiments of the present invention, the fan-out wiring 300 may have a multi-layered structure.

The second gate insulation layer 190 may be disposed on the first gate electrode 170. The second gate insulation layer 190 may cover at least a portion of the first gate electrode 170 in the pixel region 30 on the first gate insulation layer 150, and may extend substantially in the first direction D1. In addition, the second gate insulation layer 190 may cover at least a portion of the first fan-out wiring 301 in the first peripheral region 40 and the second fan-out wiring 302 in the second peripheral region 60 on the first gate insulation layer 150.

For example, the second gate insulation layer 190 may cover at least a portion of the first gate electrode 170, the first fan-out wiring 301, and the second fan-out wiring 302 on the first gate insulation layer 150, and may have a substantially level surface without a step around the first gate electrode 170, the first fan-out wiring 301, and the second fan-out wiring 302. Alternatively, the second gate insulation layer 190 may cover at least a portion of the first gate electrode 170, the first fan-out wiring 301, and the second fan-out wiring 302 on the first gate insulation layer 150, and may be disposed as a substantially uniform thickness along a profile of the first gate electrode 170, the first fan-out wiring 301, and the second fan-out wiring 302. According to exemplary embodiments of the present invention, the second gate insulation layer 190 may be disposed in the pixel region 30, the first peripheral region 40, and the second peripheral region 60 on the first gate insulation layer 150, and may have an opening exposing the upper surface of the substrate 110 that is disposed in the bending region 50 and the first portion 116 of the buffer layer 115. The second gate insulation layer 190 may include silicon compound, metal oxide, etc.

The second gate electrode 175 may be disposed on a portion of the second gate insulation layer 190 under which the first gate electrode 170 is disposed. Alternatively, the first gate electrode 170 and the second gate electrode 175 may serve as a storage capacitor. The second gate electrode 175 may include a metal, a metal alloy, metal nitride, conductive metal oxide, transparent conductive materials, etc. These may be used alone or in a suitable combination thereof. In some exemplary embodiments of the present disclosure, the second gate electrode 175 may have a multi-layered structure.

The insulating interlayer 195 may be disposed on the second gate electrode 175. The insulating interlayer 195 may cover at least a portion of the second gate electrode 175 in the pixel region 30 on the second gate insulation layer 190, and may extend substantially in the first direction D1. For example, the insulating interlayer 195 may cover at least a portion of the second gate electrode 175 on the second gate insulation layer 190, and may have a substantially level surface without a step around the second gate electrode 175. Alternatively, the insulating interlayer 195 may cover at least a portion of the second gate electrode 175 on the second gate insulation layer 190, and may be disposed as a substantially uniform thickness along a profile of the second gate electrode 175. According to exemplary embodiments of the present invention, the insulating interlayer 195 may be disposed in the pixel region 30, the first peripheral region 40, and the second peripheral region 60 on the second gate insulation layer 190, and may have an opening exposing the upper surface of the substrate 110 that is disposed in the bending region 50 and the first portion 116 of the buffer layer 115. The insulating interlayer 195 may include a silicon compound, a metal oxide, etc. Accordingly, the insulation layer structure 200 including the first gate insulation layer 150, the second gate insulation layer 190, and the insulating interlayer 195 may be disposed.

For example, the insulation layer structure 200 may include a plurality of insulation layers, and the fan-out wiring 300 may be disposed between adjacent two insulation layers among the plurality of insulation layers. In addition, an opening of the first gate insulation layer 150, an opening of the second gate insulation layer 190, and an opening of the insulating interlayer 195 may be defined as a second opening 502 of the insulation layer structure 200 (refer to FIG. 5). According to exemplary embodiments of the present invention, the second opening 502 may overlap the first opening 501, and a size of the second opening 502 of the insulation layer structure 200 may be greater than a size of the first opening 501 of the buffer layer 115.

The source electrode 210 and the drain electrode 230 may be disposed in the pixel region 30 on the insulation layer structure 200. The source electrode 210 may be in direct contact with a source region of the active layer 130 via a contact hole formed by removing a portion of the insulation layer structure 200. The drain electrode 230 may be in direct contact with a drain region of the active layer 130 via a contact hole formed by removing another portion of the insulation layer structure 200. Each of the source electrode 210 and the drain electrode 230 may include a metal, an alloy, metal nitride, conductive metal oxide, transparent conductive materials, etc. These may be used alone or in a suitable combination thereof. In some exemplary embodiments of the present invention, each of the source and drain electrodes 210 and 230 may have a multi-layered structure. Accordingly, the semiconductor element 250 including the active layer 130, the first gate electrode 170, the second gate electrode 175, the source electrode 210, and the drain electrode 230 may be disposed.

According to exemplary embodiments of the present invention, the semiconductor element 250 has a top gate structure, but not being limited thereto. For example, in some exemplary embodiments of the present disclosure, the semiconductor element 250 may have a bottom gate structure. In addition, a configuration of the semiconductor element 250 may include the first gate insulation layer 150, the second gate insulation layer 190, and the insulating interlayer 195.

The conductive pattern 460 may be disposed in the first and second peripheral regions 40 and 60 that are disposed adjacent to the bending region 50 on the insulation layer structure 200, and might not be disposed on the upper surface of the substrate 110 disposed in the bending region 50 and the first portion 116 of the buffer layer 115 such that the upper surface of the substrate 110 disposed in the bending region 50 and the first portion 116 of the buffer layer 115 are exposed. According to exemplary embodiments of the present invention, the conductive pattern 460 may include the first conductive pattern 401 and the second conductive pattern 402. The first conductive pattern 401 may be in direct contact with the first fan-out wiring 301 via a first contact hole formed by removing a first portion of the insulation layer structure 200 in the first peripheral region 40 on the insulation layer structure 200, and the second conductive pattern 402 may be in direct contact with the second fan-out wiring 302 via a second contact hole formed by removing a second portion of the insulation layer structure 200 in the second peripheral region 60 on the insulation layer structure 200.

According to exemplary embodiments of the present invention, the conductive pattern 460, the source electrode 210, and the drain electrode 230 may be disposed at the same level, and may be simultaneously formed using the same materials. For example, the conductive pattern 460 may include a metal, an alloy of a metal, metal nitride, conductive metal oxide, transparent conductive materials, etc. These may be used alone or in a suitable combination thereof. In some exemplary embodiments of the present invention, the conductive pattern 460 may have a multi-layered structure.

The first planarization layer 270 may be disposed on the insulation layer structure 200, the source electrode 210, the drain electrode 230, and the conductive pattern 460. The first planarization layer 270 may cover at least a portion of the source and drain electrodes 210 and 230 in the pixel region 30 on the insulation layer structure 200, and may cover at least a portion of the conductive pattern 460 in the first peripheral region 40, the bending region 50, and the second peripheral region 60 on the insulation layer structure 200. According to exemplary embodiments of the present invention, the first planarization layer 270 may be in direct contact with a lower surface of the connection electrode 330, the side walls of the insulation layer structure 200 that is disposed adjacent to the bending region 50 (e.g., side walls of the second opening 502), the first portion 116 of the buffer layer 115, and the upper surface of the substrate 110 that is disposed in the bending region 50. In addition, the first planarization layer 270 may be disposed in the first opening 501 and the second opening 502, and may completely cover both lateral portions of the conductive pattern 460. For example, the first planarization layer 270 may be disposed under the connection electrode 330 in a portion of the first peripheral region 40, the bending region 50, and a portion of the second peripheral region 60 on the substrate 110, or may be disposed between the connection electrode 330 and the substrate 110.

For example, the first planarization layer 270 may be disposed relatively thickly. In this case, the first planarization layer 270 may have a substantially flat upper surface, and a planarization process may be further performed on the first planarization layer 270 to implement the flat upper surface of the first planarization layer 270. Alternatively, the first planarization layer 270 may cover at least a portion of the source and drain electrodes 210 and 230, the insulation layer structure 200, and the buffer layer 115, and may be disposed as a substantially uniform thickness along a profile of the source and drain electrodes 210 and 230, the insulation layer structure 200, and the buffer layer 115. The first planarization layer 270 may include organic materials and/or inorganic materials. According to exemplary embodiments of the present invention, the first planarization layer 270 may include organic materials such as a photoresist, a polyacryl-based resin, a polyimide-based resin, a polyamide-based resin, a siloxane-based resin, an acryl-based resin, or an epoxy-based resin.

The wiring pattern 215 and the connection pattern 235 may be disposed in the pixel region 30 on the first planarization layer 270. Scan signals, data signals, light emission signals, initialization signals, power supply voltage, etc. may be transferred through the wiring pattern 215. The connection pattern 235 may be in contact with the drain electrode 230 via a contact hole formed by removing a portion of the first planarization layer 270 that is disposed in the pixel region 30, and may electrically connect the lower electrode 290 and the drain electrode 230. Each of the wiring pattern 215 and the connection pattern 235 may include a metal, an alloy of a metal, metal nitride, conductive metal oxide, transparent conductive materials, etc. These may be used alone or in a suitable combination thereof. In some exemplary embodiments of the present invention, each of the wiring pattern 215 and the connection pattern 235 may have a multi-layered structure.

The connection electrode 330 may be disposed in a portion of the first peripheral region 40, the bending region 50, and a portion of the second peripheral region 60 on the first planarization layer 270. The connection electrode 330 may be in direct contact with the conductive pattern 460, and may be electrically connected to the fan-out wiring 300. For example, the first planarization layer 270 may include a third contact hole that is disposed in the first peripheral region 40 and a fourth contact hole that is disposed in the second peripheral region 60. Here, the connection electrode 330 may be in direct contact with the first conductive pattern 401 via the third contact hole in the first peripheral region 40, and may be in direct contact with the second conductive pattern 402 via the fourth contact hole in the second peripheral region 60. As the connection electrode 330 electrically connects the first fan-out wiring 301 and the second fan-out wiring 302 through the conductive pattern 460, scan signals, data signals, light emission signals, initialization signals, power supply voltage, etc. that are applied from an external device 101 may be provided to the pixel structure 400. According to exemplary embodiments of the present invention, the connection electrode 330, the wiring pattern 215, and the connection pattern 235 may be disposed at the same level, and may be simultaneously formed using the same material. The connection electrode 330 may include a metal, an alloy of a metal, metal nitride, conductive metal oxide, transparent conductive material, etc. These may be used alone or in a suitable combination thereof. In some exemplary embodiments of the present invention, the connection electrode 330 may have a multi-layered structure.

The second planarization layer 275 may be disposed on the wiring pattern 215, the connection pattern 235, the connection electrode 330, and the first planarization layer 270. The second planarization layer 275 may cover at least a portion of the wiring pattern 215 and the connection pattern 235 in the pixel region 30 on the first planarization layer 270 and extend substantially in the first direction D1, and may cover at least a portion of the connection electrode 330 in the first peripheral region 40, the bending region 50, and the second peripheral region 60. For example, the second planarization layer 275 may be disposed on the entire substrate 110.

Alternatively, the OLED device 100 may further include a block region extending along the second direction D2 in a portion of the first peripheral region 40 that is disposed between the pixel region 30 and the bending region 50 (refer to FIG. 1). The block region may be disposed in parallel to the bending region 50, and the first planarization layer 270, the second planarization layer 275, and the pixel defining layer 310 might not be disposed in the block region. For example, the first planarization layer 270, the second planarization layer 275, and the pixel defining layer 310 might not be disposed in the block region so as to block water or moisture permeated into the pixel region 30 through the first planarization layer 270 and the second planarization layer 275 that are disposed in the second peripheral region 60 and/or the bending region 50.

The second planarization layer 275 may be disposed relatively thickly so as to cover at least a portion of the wiring pattern 215, the connection pattern 235, and the connection electrode 330. In this case, the second planarization layer 275 may have a substantially flat upper surface, and a planarization process may be further performed on the second planarization layer 275 to implement the flat upper surface of the second planarization layer 275. Alternatively, the second planarization layer 275 may cover at least a portion of the wiring pattern 215, the connection pattern 235, and the connection electrode 330, and may be disposed as a substantially uniform thickness along a profile of the wiring pattern 215, the connection pattern 235, and the connection electrode 330. The second planarization layer 275 may include organic materials and/or inorganic materials. According to exemplary embodiments of the present invention, the second planarization layer 275 may include organic materials.

The lower electrode 290 may be disposed in the pixel region 30 on the second planarization layer 275. The lower electrode 290 may be in contact with the drain electrode 230 via a contact hole formed by removing a portion of the second planarization layer 275. In addition, the lower electrode 290 may be electrically connected to the semiconductor element 250. The lower electrode 290 may include a metal, a metal alloy, metal nitride, conductive metal oxide, transparent conductive materials, etc. These may be used alone or in a suitable combination thereof. In some exemplary embodiments of the present invention, the lower electrode 290 may have a multi-layered structure.

The pixel defining layer 310 may be disposed in the pixel region 30 on the second planarization layer 275, and may expose a portion of the lower electrode 290. For example, the pixel defining layer 310 may cover at least a portion of both lateral portions of the lower electrode 290 and extend substantially in the first direction D1, and may be disposed in the first peripheral region 40, the bending region 50, and the second peripheral region 60. Alternatively, the pixel defining layer 310 may be disposed only in the pixel region 30, and might not be disposed in the first peripheral region 40, the bending region 50, and the second peripheral region 60. The pixel defining layer 310 may include organic materials and/or inorganic materials. According to exemplary embodiments of the present invention, the pixel defining layer 310 may include organic materials.

The light emitting layer 335 may be disposed on a portion of the lower electrode 290 exposed by the pixel defining layer 310. The light emitting layer 335 may be formed using at least one light emitting material capable of generating different colors of light (e.g., red light, blue light, and green light, etc.) according to sub-pixels. Alternatively, the light emitting layer 335 may generally generate white light by stacking a plurality of light emitting materials capable of generating different colors of light such as red light, green light, blue light, etc. In this case, a color filter may be disposed on the light emitting layer 335. The color filter may include a red color filter, a green color filter, and/or a blue color filter. Alternatively, the color filter may include a yellow color filter, a cyan color filter, and a magenta color filter. The color filter may include a photosensitive resin (or color photoresist), etc.

The upper electrode 340 may be disposed in the pixel region 30 on the pixel defining layer 310 and the light emitting layer 335. The upper electrode 340 may include a metal, a metal alloy, metal nitride, conductive metal oxide, transparent conductive materials, etc. These may be used alone or in a suitable combination thereof. In some exemplary embodiments of the present invention, the upper electrode 340 may have a multi-layered structure. Accordingly, the pixel structure 400 including the lower electrode 290, the light emitting layer 335, and the upper electrode 340 may be disposed.

The TFE structure 450 may be disposed on the upper electrode 340. The TFE structure 450 may include the first TFE layer 451, the second TFE layer 452, and the third TFE layer 453. For example, the second TFE layer 452 may be disposed on the first TFE layer 451, and the third TFE layer 453 may be disposed on the second TFE layer 452.

The first TFE layer 451 may be disposed in the pixel region 30 on the upper electrode 340. The first TFE layer 451 may cover at least a portion of the upper electrode 340, and may be disposed as a substantially uniform thickness along a profile of the upper electrode 340. The first TFE layer 451 may prevent the pixel structure 400 from being deteriorated by the permeation of moisture, water, oxygen, etc. In addition, the first TFE layer 451 may protect the pixel structure 400 from external impact. The first TFE layer 451 may include inorganic materials.

The second TFE layer 452 may be disposed on the first TFE layer 451. The second TFE layer 452 may increase the flatness of the OLED device 100, and may protect the pixel structure 400. The second TFE layer 452 may include organic materials.

The third TFE layer 453 may be disposed on the second TFE layer 452. The third TFE layer 453 may cover at least a portion of the second TFE layer 452, and may be disposed as a substantially uniform thickness along a profile of the second TFE layer 452. The third TFE layer 453 together with the first TFE layer 451 and the second TFE layer 452 may prevent the pixel structure 400 from being deteriorated by the permeation of moisture, water, oxygen, etc. In addition, the third TFE layer 453, together with the and the second TFE layers 451 and 452, may protect the pixel structure 400 from external impact. The third TFE layer 453 may include inorganic materials. Accordingly, the TFE structure 450 may include the first TFE layer 451, the second TFE layer 452, and the third TFE layer 453.

Alternatively, the TFE structure 450 may have a five-layer structure where first to fifth TFE layers are stacked or a seven-layer structure where the first to seventh TFE layers are stacked.

In some exemplary embodiments of the present invention, the OLED device 100 may further include a lower protection film and a bending protection layer. The lower protection film may be disposed on a lower surface of the substrate 110. The lower protection film may protect the pixel structure 400 and the semiconductor element 250. The lower protection film may be entirely disposed in the pixel region 30, the first peripheral region 40, and the second peripheral region 60, and may expose a lower surface of the substrate 110 that is disposed in the bending region 50. The lower protection film may include polyethylene terephthalate (PET), polyethylene naphthalate (PEN), polypropylene (PP), polycarbonate (PC), polystyrene (PS), polysulfone (PSul), polyethylene (PE), polyphthalamide (PPA), polyethersulfone (PES), polyarylate (PAR), polycarbonate oxide (PCO), modified polyphenylene oxide (MPPO), etc.

The bending protection layer may be disposed in a portion of the first peripheral region 40, the bending region 50, and a portion of the pad electrode region 60 on the pixel defining layer 310. The bending protection layer may protect the connection electrode 330, and may raise a neutral plane of the bending region 50 in a third direction D3 that is vertical to the first and second directions D1 and D2. For example, when the bending region 50 is bent, the connection electrodes 330 might not be broken because the neutral plane of the bending region 50 is disposed within a portion where the connection electrodes 330 are disposed. The bending protection layer 460 may include organic materials such as polyimide, epoxy-based resin, acryl-based resin, polyester, photoresist, polyacryl-based resin, polyimide-based resin, a polyamide-based resin, a siloxane-based resin, etc, and may include elastic materials such as silicon, urethane, thermoplastic poly urethane (TPU), etc.

As the OLED device 100 in accordance with exemplary embodiments of the present invention is manufactured through a relatively reduced mask process, a manufacturing cost of the OLED device 100 may be relatively reduced. In addition, as the insulation layer structure 200 is not disposed in the first peripheral region 40 and the second peripheral region 60 that are disposed adjacent to the bending region 50, the bending region 50 of the OLED device 100 may be readily bent, and the OLED device 100 may serve as a flexible OLED device having a shape where the bending region 50 is bent.

FIGS. 6, 7, 8, 9, 10, 11, 12, 13, 14, 15, 16, 17, 18, and 19 are cross-sectional views illustrating a method of manufacturing an OLED device in accordance with exemplary embodiments of the present invention. For example, FIG. 10 is an enlarged cross-sectional view corresponding to region 'B' of FIG. 9, and FIG. 10 is a cross-sectional view for describing a buffer layer of FIG. 9. In addition, FIG. 14 is an enlarged cross-sectional view corresponding to region 'C' of FIG. 13.

Figure 6:
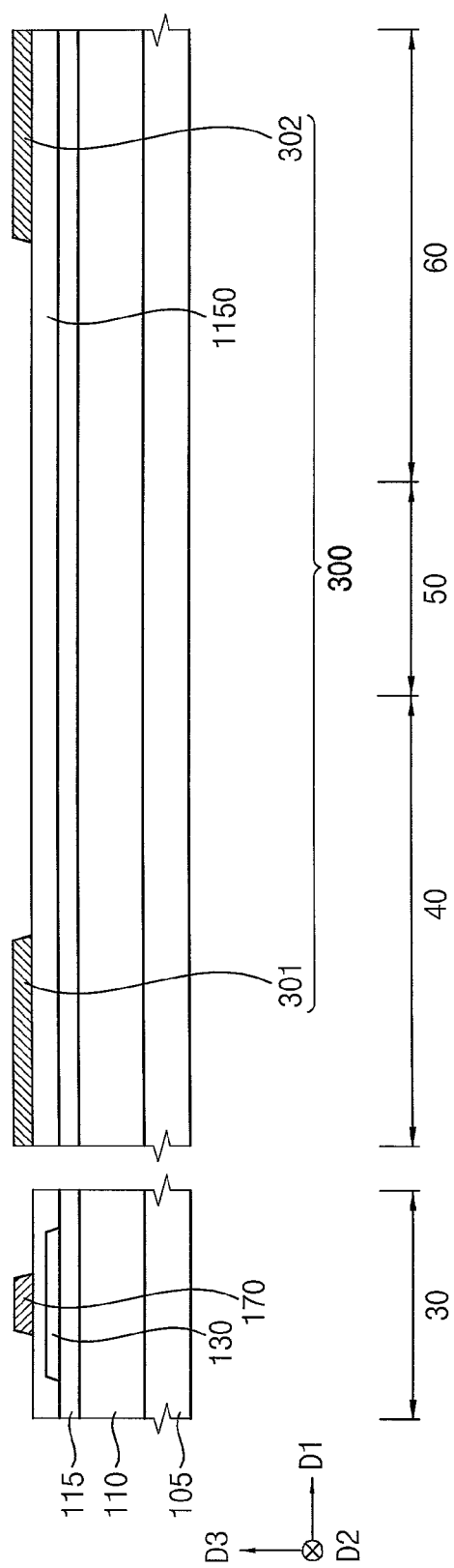

Referring to FIG. 6, a rigid glass substrate 105 may be provided. A substrate 110 including transparent or opaque insulation materials may be formed on the glass substrate 105. The substrate 110 may be formed using a flexible transparent material such as a flexible transparent resin substrate. According to exemplary embodiments of the present invention, the substrate 110 may have a configuration where a first organic layer, a first barrier layer, a second organic layer, and a second barrier layer are sequentially stacked. The first barrier layer and the second barrier layer each may be formed using inorganic materials, and the first organic layer and the second organic layer each may be formed using organic materials. For example, each of the first and second barrier layers may include silicon oxide, and may block moisture or water that is permeated through the first and second organic layers. Further, each of the first and second organic layers may include a polyimide-based resin.

A buffer layer 115 may be formed on the substrate 110. According to exemplary embodiments of the present invention, the buffer layer 115 may be entirely formed in a pixel region 30, a first peripheral region 40, a bending region 50, and a second peripheral region 60 on the substrate 110. The buffer layer 115 may prevent the diffusion of metal atoms and/or impurities from the substrate 110 into a semiconductor element. In addition, the buffer layer 115 may control a rate of a heat transfer in a crystallization process for forming an active layer, thereby obtaining substantially uniform active layer. Further, the buffer layer 115 may increase a surface flatness of the substrate 110 when a surface of the substrate 110 is relatively irregular. The buffer layer 115 may be formed using silicon compound, metal oxide, etc.

An active layer 130 may be formed in the pixel region 30 on the buffer layer 115. The active layer 130 may be formed using an oxide semiconductor, an inorganic semiconductor, an organic semiconductor, etc. For example, a preliminary active layer may be disposed on the buffer layer 115, and then the active layer 130 may be formed by selectively performing a first etching process in the preliminary active layer.

A preliminary first gate insulation layer 1150 may be formed on the active layer 130. The preliminary first gate insulation layer 1150 may cover at least a portion of the active layer 130 in the pixel region 30 on the buffer layer 115, and may extend substantially in a first direction D1 from the pixel region 30 into the second peripheral region 60. For example, the preliminary first gate insulation layer 1150 may be formed on the entire buffer layer 115. For example, the preliminary first gate insulation layer 1150 may cover at least a portion of the active layer 130 on the buffer layer 115, and may have a substantially level surface without a step around the active layer 130. Alternatively, the preliminary first gate insulation layer 1150 may cover at least a portion of the active layer 130 on the buffer layer 115, and may be formed as a substantially uniform thickness along a profile of the active layer 130. The preliminary first gate insulation layer 1150 may be formed using silicon compound, metal oxide, etc.

A first gate electrode 170 may be formed on a portion of the preliminary first gate insulation layer 1150 under which the active layer 130 is disposed. The first gate electrode 170 may be formed using a metal, a metal alloy, metal nitride, conductive metal oxide, transparent conductive materials, etc. These may be used alone or in a suitable combination thereof. In some exemplary embodiments of the present invention, the first gate electrode 170 may have a multi-layered structure.

A fan-out wiring 300 may be formed in the first and second peripheral regions 40 and 60 that are disposed adjacent to the bending region 50 on the preliminary first gate insulation layer 1150, and might not be formed on an upper surface of the substrate 110 located in the bending region 50 and a first portion 116 of the buffer layer 115 such that the upper surface of the substrate 110 disposed in the bending region 50 and the first portion 116 of the buffer layer 115 are exposed. According to exemplary embodiments of the present invention, the fan-out wiring 300 may include a first fan-out wiring 301 and a second fan-out wiring 302. The first fan-out wiring 301 may extend along the first direction D1 in the first peripheral region 40 on the preliminary first gate insulation layer 1150, and may be electrically connected to a pixel structure 400, which will be described below, that is disposed in the pixel region 30. In addition, the second fan-out wiring 302 may extend along the first direction D1 in the second peripheral region 60 on the preliminary first gate insulation layer 1150, and may be electrically connected to an external device 101 through pad electrodes 470 that are formed in the second peripheral region 60.

The fan-out wiring 300 may be formed using a metal, a metal alloy, metal nitride, conductive metal oxide, transparent conductive materials, etc. According to exemplary embodiments of the present invention, the fan-out wiring 300 and the first gate electrode 170 may be simultaneously formed using the same material. For example, a preliminary first metal wiring may be formed on the entire preliminary first gate insulation layer 150, and then the first gate electrode 170 and the fan-out wiring 300 may be formed by selectively performing a second etching process in the preliminary first metal wiring. The fan-out wiring 300 may include Au, Ag, Al, Pt, Ni, Ti, Pd, Mg, Ca, Li, Cr, Ta, W, Cu, Mo, Sc, Nd, Ir, an alloy of aluminum, AlNx, an alloy of silver, WNx, an alloy of copper, an alloy of molybdenum, TiNx, CrNx, TaNx, SRO, ZnOx, ITO, SnOx, InOx, GaOx, IZO, etc. These may be used alone or in a suitable combination thereof. In some exemplary embodiments of the present invention, the fan-out wiring 300 may have a multi-layered structure.

Figure 7:
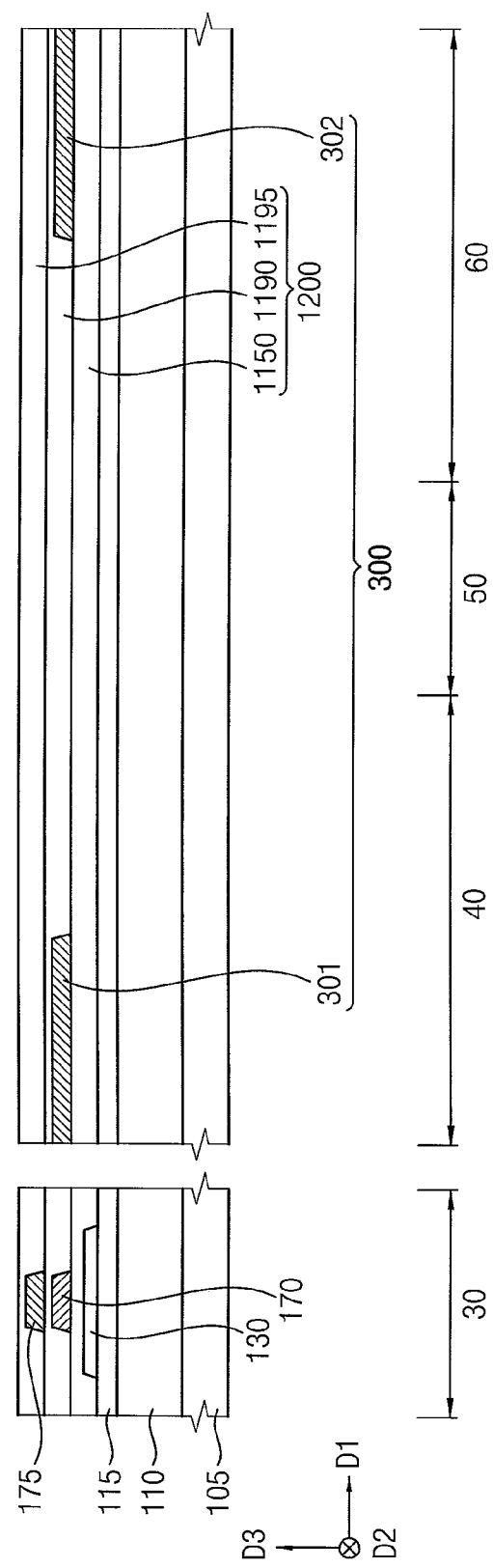

Referring to FIG. 7, a preliminary second gate insulation layer 1190 may be formed on the preliminary first gate insulation layer 1150, the first gate electrode 170, and the fan-out wiring 300. The preliminary second gate insulation layer 1190 may cover at least a portion of the first gate electrode 170 in the pixel region 30 on the preliminary first gate insulation layer 1150, and may extend substantially in the first direction D1. In addition, the preliminary second gate insulation layer 1190 may cover at least a portion of the first fan-out wiring 301 in the first peripheral region 40 and the second fan-out wiring 302 in the second peripheral region 60 on the preliminary first gate insulation layer 1150.

For example, the preliminary second gate insulation layer 1190 may be formed on the entire preliminary first gate insulation layer 1150. For example, the preliminary second gate insulation layer 1190 may cover at least a portion of the first gate electrode 170, the first fan-out wiring 301, and the second fan-out wiring 302 on the preliminary first gate insulation layer 1150, and may have a substantially level surface without a step around the first gate electrode 170, the first fan-out wiring 301, and the second fan-out wiring 302. Alternatively, the preliminary second gate insulation layer 1190 may cover at least a portion of the first gate electrode 170, the first fan-out wiring 301, and the second fan-out wiring 302 on the preliminary first gate insulation layer 1150, and may be formed as a substantially uniform thickness along a profile of the first gate electrode 170, the first fan-out wiring 301, and the second fan-out wiring 302. According to exemplary embodiments of the present invention, the preliminary second gate insulation layer 1190 may be formed using silicon compound, metal oxide, etc.

A second gate electrode 175 may be formed on a portion of the preliminary second gate insulation layer 1190 under which the first gate electrode 170 is disposed. For example, a preliminary second metal wiring may be formed on the entire preliminary second gate insulation layer 1190, and then the second gate electrode 175 may be formed by selectively performing a third etching process in the preliminary second metal wiring. The second gate electrode 175 may be formed using a metal, a metal alloy, metal nitride, conductive metal oxide, transparent conductive materials, etc. These may be used alone or in a suitable combination thereof. In some exemplary embodiments of the present invention, the second gate electrode 175 may have a multi-layered structure.

A preliminary insulating interlayer 1195 may be formed on the second gate electrode 175. The preliminary insulating interlayer 1195 may cover at least a portion of the second gate electrode 175 in the pixel region 30 on the preliminary second gate insulation layer 1190, and may extend substantially in the first direction D1. For example, the preliminary insulating interlayer 1195 may be formed on the entire preliminary second gate insulation layer 1190. For example, the preliminary insulating interlayer 1195 may cover at least a portion of the second gate electrode 175 on the preliminary second gate insulation layer 1190, and may have a substantially level surface without a step around the second gate electrode 175. Alternatively, the preliminary insulating interlayer 1195 may cover at least a portion of the second gate electrode 175 on the first preliminary insulating interlayer 1190, and may be formed as a substantially uniform thickness along a profile of the second gate electrode 175. According to exemplary embodiments of the present invention, the preliminary insulating interlayer 1195 may be formed using a silicon compound, a metal oxide, etc. Accordingly, a preliminary insulation layer structure 1200 including the preliminary first gate insulation layer 1150, the preliminary second gate insulation layer 1190, and the preliminary insulating interlayer 1195 may be formed.

Figure 8:
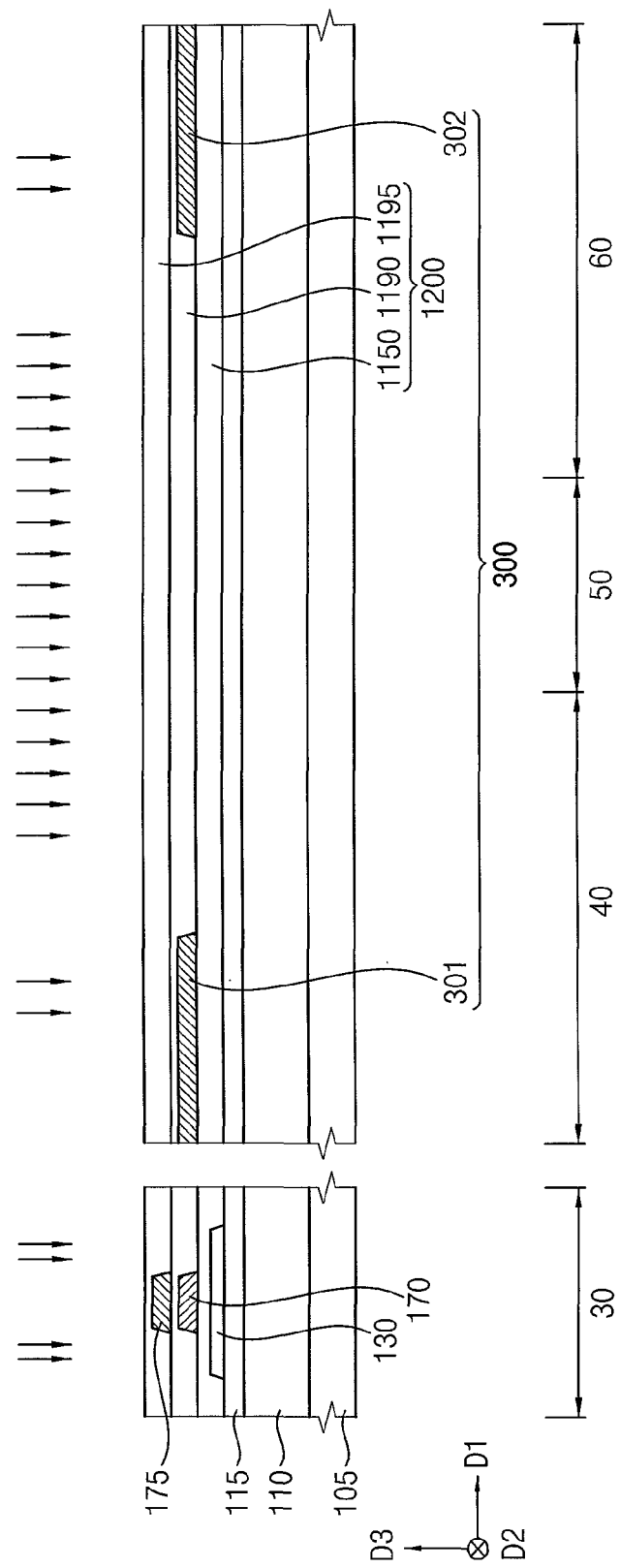
Figure 9:
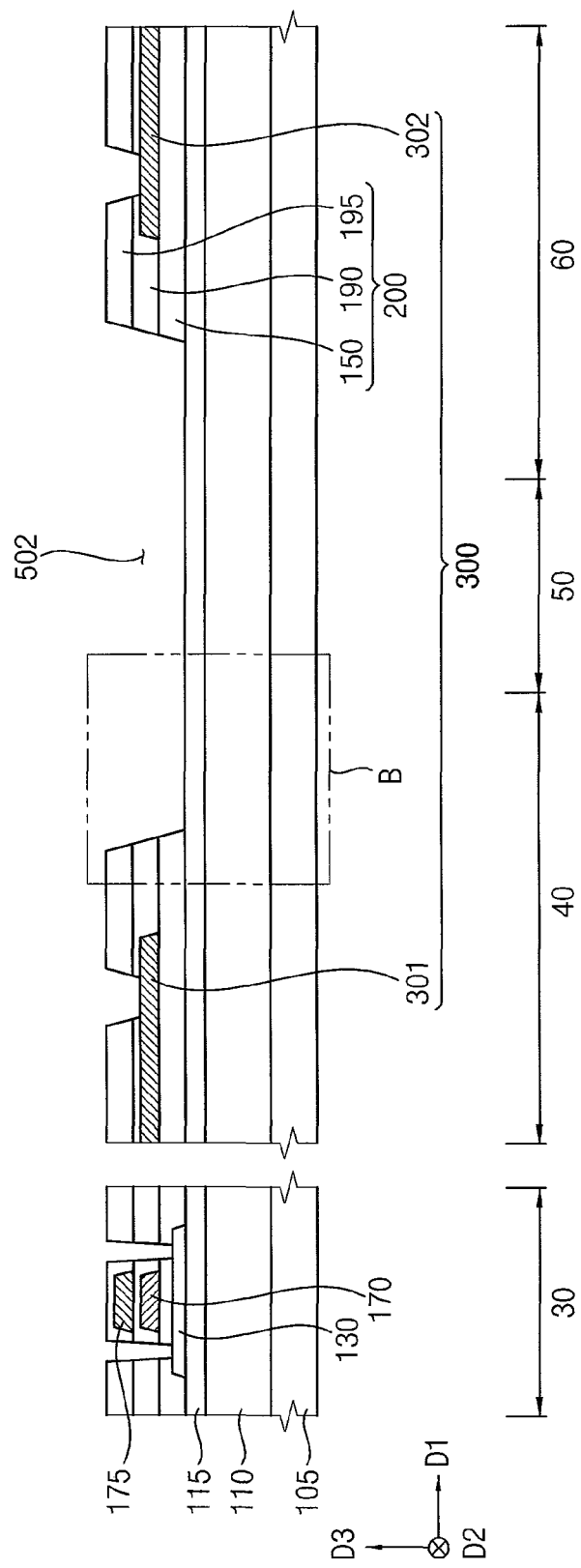

Referring to FIG. 8, a fourth etching process may be selectively performed a on the preliminary insulation layer structure 1200. For example, the fourth etching process may be performed in a dry etching process using a gas mixed with fluorocarbon and/or oxygen. Alternatively, the fourth etching process may be performed in a wet etching process using an etchant.

Referring to FIGS. 9, and 10, source and drain regions of the active layer 130 in the pixel region 30 may be exposed through the fourth etching process. In addition, an insulation layer structure 200 may be formed by removing a portion of the preliminary insulation layer structure 1200 in a portion of the first peripheral region 40 that is disposed adjacent to the bending region 50, the bending region 50, and a portion of the second peripheral region 60 that is disposed adjacent to the bending region 50 through the fourth etching process.

For example, a second opening 502 exposing an upper surface of the buffer layer 115 that is disposed in a portion of the first peripheral region 40, the bending region 50, and a portion of the second peripheral region 60 may be formed in the insulation layer structure 200 through the fourth etching process. In addition, a first contact hole formed by removing a first portion of the preliminary insulation layer structure 1200 in the first peripheral region 40 and a second contact hole formed by removing a second portion of the preliminary insulation layer structure 1200 in the second peripheral region 60 may be formed through the fourth etching process. The first contact hole may expose a portion of the first fan-out wiring 301, and the second contact hole may expose a portion of the second fan-out wiring 302.

Figure 11:
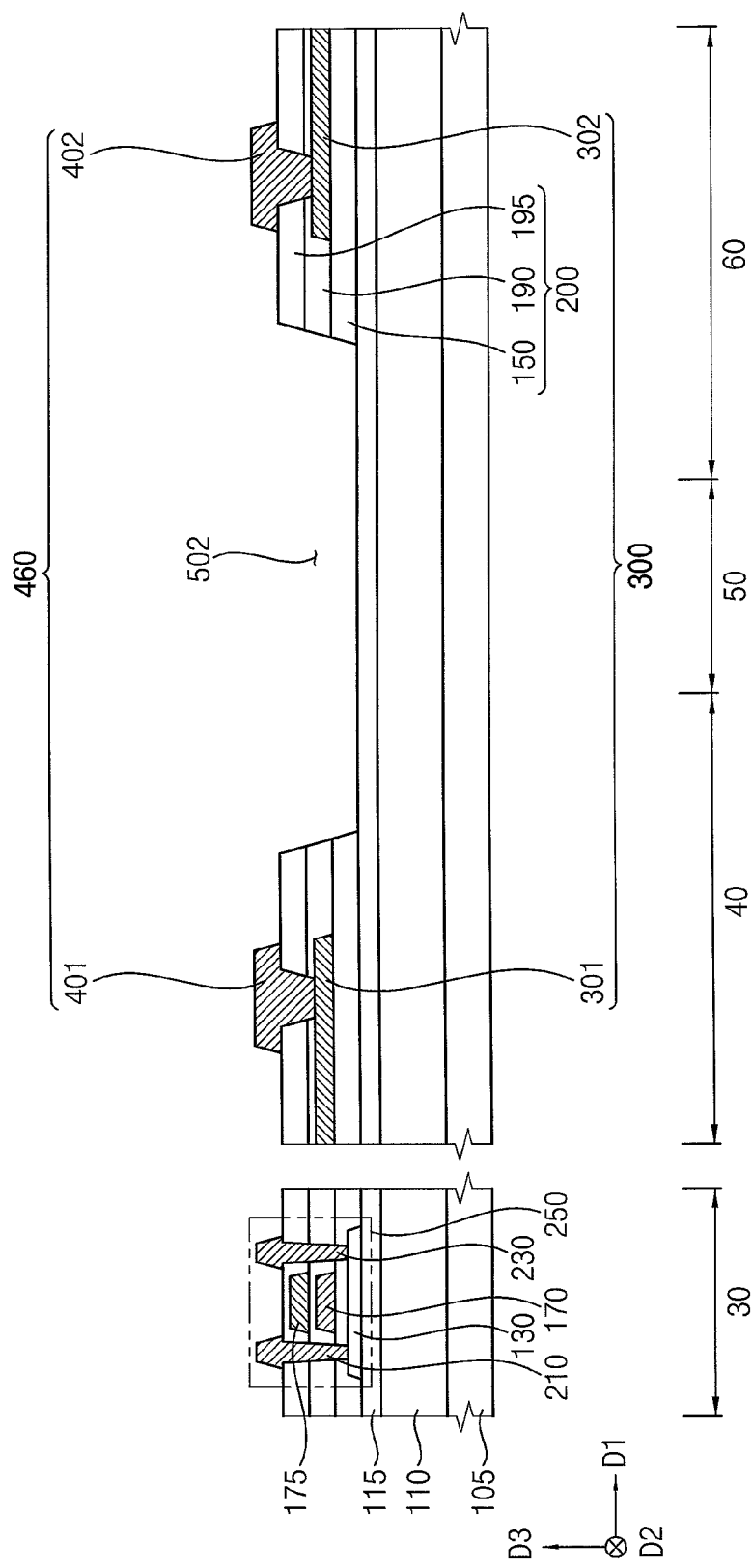

Referring to FIG. 11, a source electrode 210 and the drain electrode 230 may be formed in the pixel region 30 on the insulation layer structure 200. The source electrode 210 may be in direct contact with a source region of the active layer 130 via a contact hole formed by removing a portion of the insulation layer structure 200. The drain electrode 230 may be in direct contact with a drain region of the active layer 130 via a contact hole formed by removing another portion of the insulation layer structure 200. Each of the source electrode 210 and the drain electrode 230 may be formed using a metal, an alloy, metal nitride, conductive metal oxide, transparent conductive materials, etc. These may be used alone or in a suitable combination thereof. In some exemplary embodiments of the present invention, each of the source and drain electrodes 210 and 230 may have a multi-layered structure. Accordingly, a semiconductor element 250 including the active layer 130, the first gate electrode 170, the second gate electrode 175, the source electrode 210, and the drain electrode 230 may be formed.

A conductive pattern 460 may be formed in the first and second peripheral regions 40 and 60 that are disposed adjacent to the bending region 50 on the insulation layer structure 200, and might not be formed on the upper surface of the substrate 110 disposed in the bending region 50 and the first portion 116 of the buffer layer 115 such that the upper surface of the substrate 110 disposed in the bending region 50 and the first portion 116 of the buffer layer 115 are exposed. According to exemplary embodiments of the present invention, the conductive pattern 460 may include a first conductive pattern 401 and a second conductive pattern 402. The first conductive pattern 401 may be in direct contact with the first fan-out wiring 301 via a first contact hole formed by removing a first portion of the insulation layer structure 200 in the first peripheral region 40 on the insulation layer structure 200, and the second conductive pattern 402 may be in direct contact with the second fan-out wiring 302 via a second contact hole formed by removing a second portion of the insulation layer structure 200 in the second peripheral region 60 on the insulation layer structure 200. According to exemplary embodiments of the present invention, the conductive pattern 460, the source electrode 210, and the drain electrode 230 may be simultaneously formed using the same materials. For example, a third metal wiring may be formed on the entire insulation layer structure 200, and then the conductive pattern 460, the source electrode 210, and the drain electrode 230 may be formed by selectively performing a fifth etching process in the third metal wiring. The conductive pattern 460 may be formed using a metal, an alloy of a metal, metal nitride, conductive metal oxide, transparent conductive materials, etc. These may be used alone or in a suitable combination thereof. In some exemplary embodiments of the present invention, the conductive pattern 460 may have a multi-layered structure.

Figure 12:
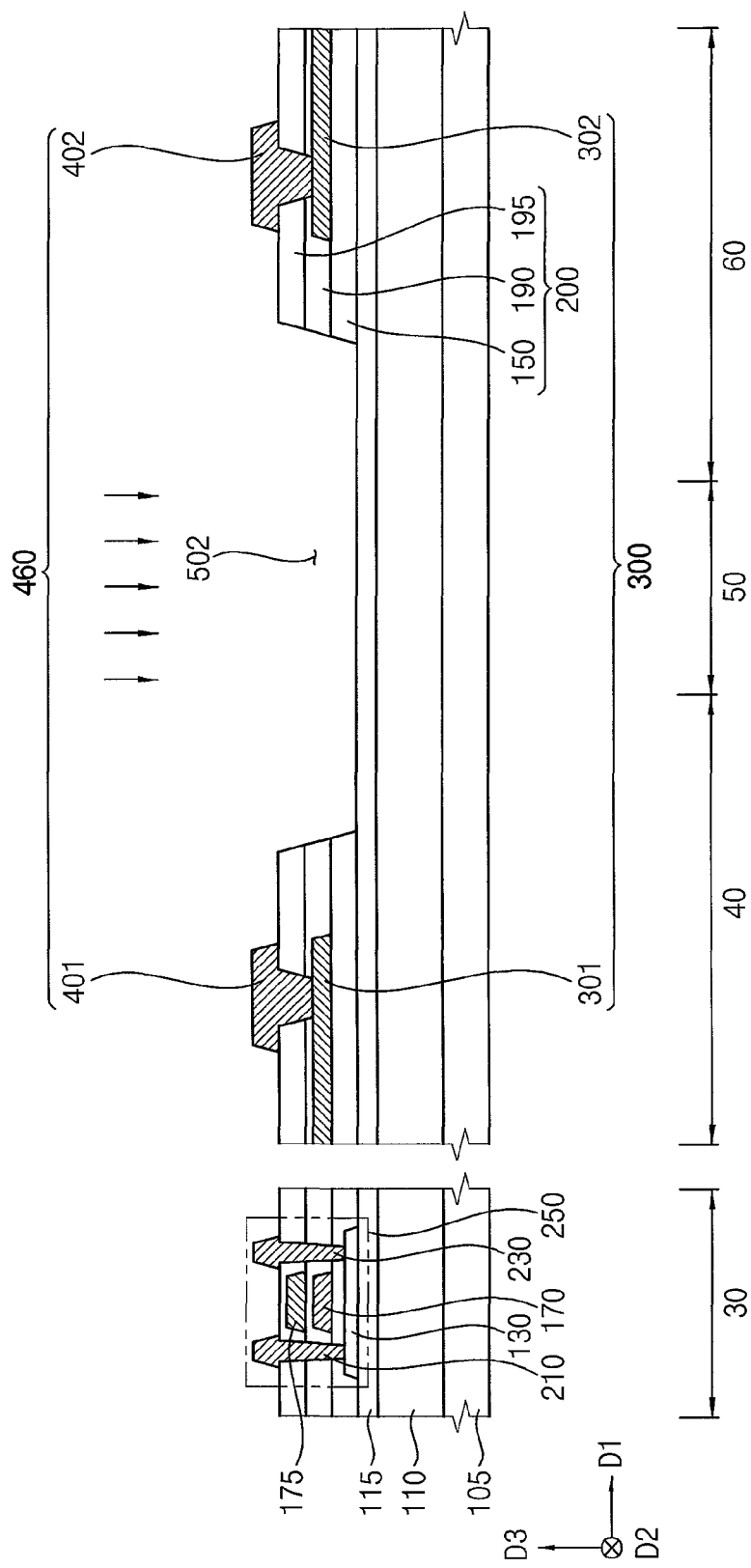

Referring to FIG. 12, a sixth etching process may be selectively performed on the buffer layer 115 exposed by the second opening 502. For example, the sixth etching process may be performed in a dry etching process using a gas mixed with fluorocarbon and/or oxygen. Alternatively, the sixth etching process may be performed in a wet etching process using an etchant.

Figure 13:
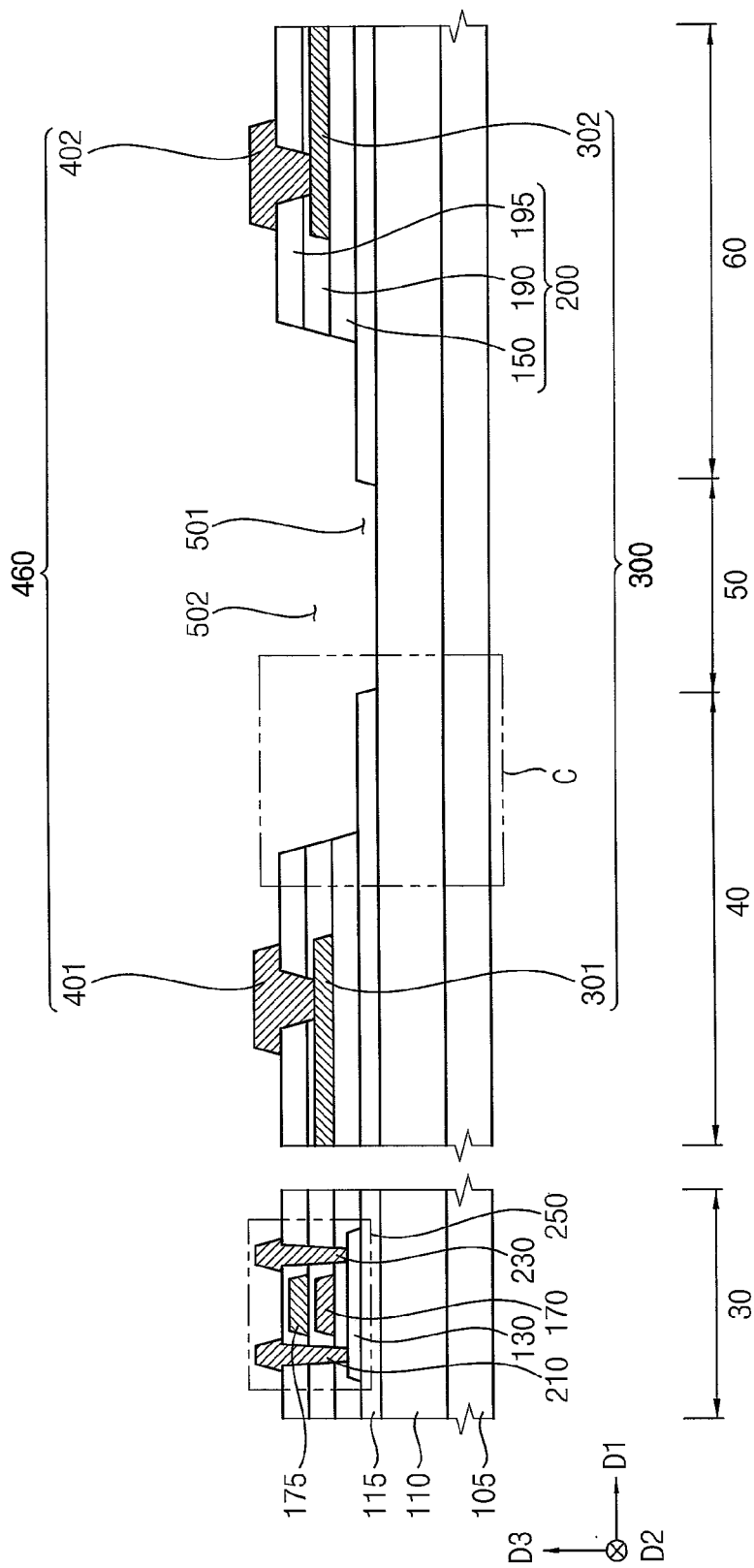
Figure 14:
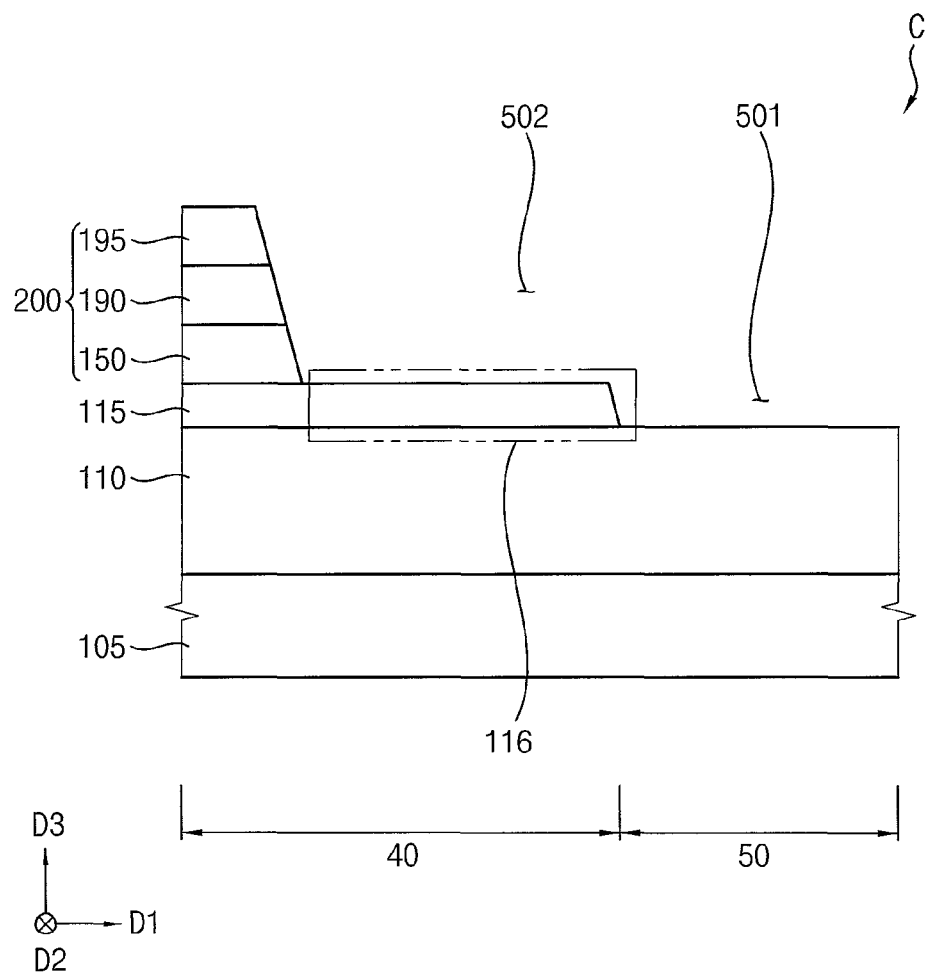

Referring to FIGS. 13 and 14, a first opening 501 exposing the upper surface of the substrate 110 that is disposed in the bending region 50 may be formed in the buffer layer 115 through the sixth etching process. Here, the first portion 116 of the buffer layer 115 may be disposed in the first and second peripheral regions 40 and 60 that are disposed adjacent to the bending region 50, and may protrude from side walls of the insulation layer structure 200. In addition, a second portion of the buffer layer 115 may be disposed in the first and second peripheral regions 40 and 60, and may overlap the insulation layer structure 200. According to exemplary embodiments of the present invention, the second opening 502 may overlap the first opening 501, and a size of the second opening 502 of the insulation layer structure 200 may be greater than a size of the first opening 501 of the buffer layer 115.

Figure 15:
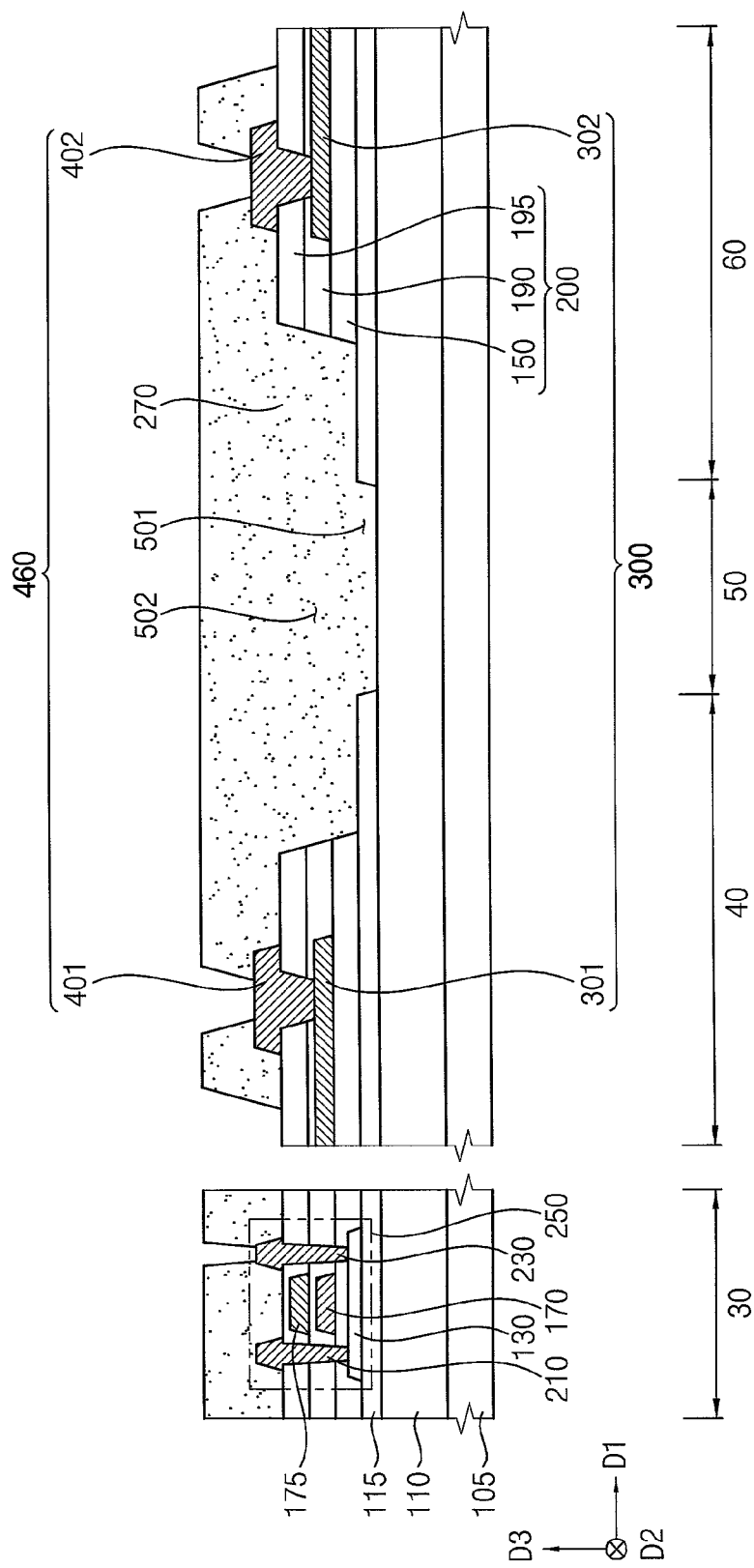

Referring to FIG. 15, a first planarization layer 270 may be formed on the insulation layer structure 200, the source electrode 210, the drain electrode 230, and the conductive pattern 460. The first planarization layer 270 may cover at least a portion of the source and drain electrodes 210 and 230 in the pixel region 30 on the insulation layer structure 200, and may cover at least a portion of the conductive pattern 460 in the first peripheral region 40, the bending region 50, and the second peripheral region 60 on the insulation layer structure 200. For example, a preliminary planarization layer may be formed on the entire insulation layer structure 200, and then the first planarization layer 270 may be formed by selectively performing a seventh etching process in the preliminary planarization layer. Here, a contact hole exposing a portion of the drain electrode 230 in the pixel region 30, a third contact hole exposing a portion of the first conductive pattern 401 in the first peripheral region 40, and a fourth contact hole exposing a portion of the second conductive pattern 402 in the second peripheral region 60 may be formed in the first planarization layer 270 through the seventh etching process. According to exemplary embodiments of the present invention, the first planarization layer 270 may be in direct contact with the side walls of the insulation layer structure 200 that is disposed adjacent to the bending region 50 (e.g., side walls of the second opening 502), the first portion 116 of the buffer layer 115, and the upper surface of the substrate 110 that is disposed in the bending region 50. In addition, the first planarization layer 270 may be formed in the first opening 501 and the second opening 502, and may cover at least a portion of both lateral portions of the conductive pattern 460. For example, the first planarization layer 270 may be disposed under the connection electrode 330 in a portion of the first peripheral region 40, the bending region 50, and a portion of the second peripheral region 60 on the substrate 110, or may be disposed between the connection electrode 330 and the substrate 110. For example, the first planarization layer 270 may be formed relatively thickly. In this case, the first planarization layer 270 may have a substantially flat upper surface, and a planarization process may be further performed on the first planarization layer 270 to implement the flat upper surface of the first planarization layer 270. Alternatively, the first planarization layer 270 may cover at least a portion of the source and drain electrodes 210 and 230, the insulation layer structure 200, and the buffer layer 115, and may be formed as a substantially uniform thickness along a profile of the source and drain electrodes 210 and 230, the insulation layer structure 200, and the buffer layer 115. The first planarization layer 270 may be formed using organic materials and/or inorganic materials. According to exemplary embodiments of the present invention, the first planarization layer 270 may include organic materials such as a photoresist, a polyacryl-based resin, a polyimide-based resin, a polyamide-based resin, a siloxane-based resin, an acryl-based resin, or an epoxy-based resin.

Figure 16:
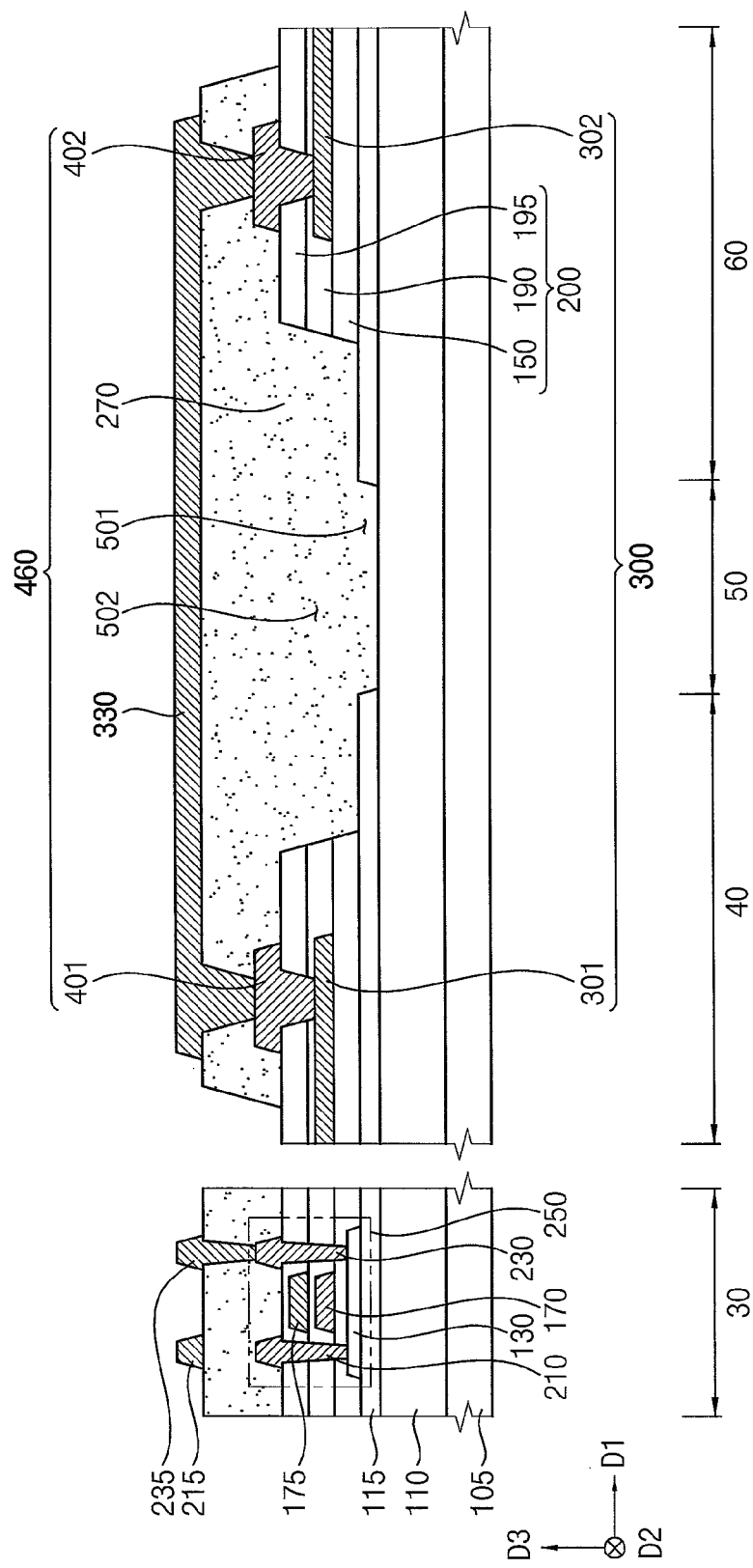

Referring to FIG. 16 a wiring pattern 215 and a connection pattern 235 may be formed in the pixel region 30 on the first planarization layer 270. Scan signals, data signals, light emission signals, initialization signals, power supply voltage, etc. may be transferred through the wiring pattern 215. The connection pattern 235 may be in contact with the drain electrode 230 via a contact hole formed by removing a portion of the first planarization layer 270 that is disposed in the pixel region 30, and may electrically connect the lower electrode 290 and the drain electrode 230. Each of the wiring pattern 215 and the connection pattern 235 may be formed using a metal, an alloy of a metal, metal nitride, conductive metal oxide, transparent conductive materials, etc. These may be used alone or in a suitable combination thereof. In some exemplary embodiments of the present invention, each of the wiring pattern 215 and the connection pattern 235 may have a multi-layered structure.

A connection electrode 330 may be formed in a portion of the first peripheral region 40, the bending region 50, and a portion of the second peripheral region 60 on the first planarization layer 270. The connection electrode 330 may be in direct contact with the conductive pattern 460, and may be electrically connected to the fan-out wiring 300. For example, the connection electrode 330 may be in direct contact with the first conductive pattern 401 via the third contact hole in the first peripheral region 40, and may be in direct contact with the second conductive pattern 402 via the fourth contact hole in the second peripheral region 60. According to exemplary embodiments of the present invention, the connection electrode 330, the wiring pattern 215, and the connection pattern 235 may be simultaneously formed using the same material. For example, a preliminary fourth metal wiring may be formed on the entire first planarization layer 270, and then the wiring pattern 215, the connection pattern 235, and the connection electrode 330 may be formed by selectively performing an eighth etching process in the preliminary fourth metal wiring. The connection electrode 330 may be formed using a metal, an alloy of a metal, metal nitride, conductive metal oxide, transparent conductive material, etc. These may be used alone or in a suitable combination thereof. In some exemplary embodiments of the present invention, the connection electrode 330 may have a multi-layered structure.

Figure 17:
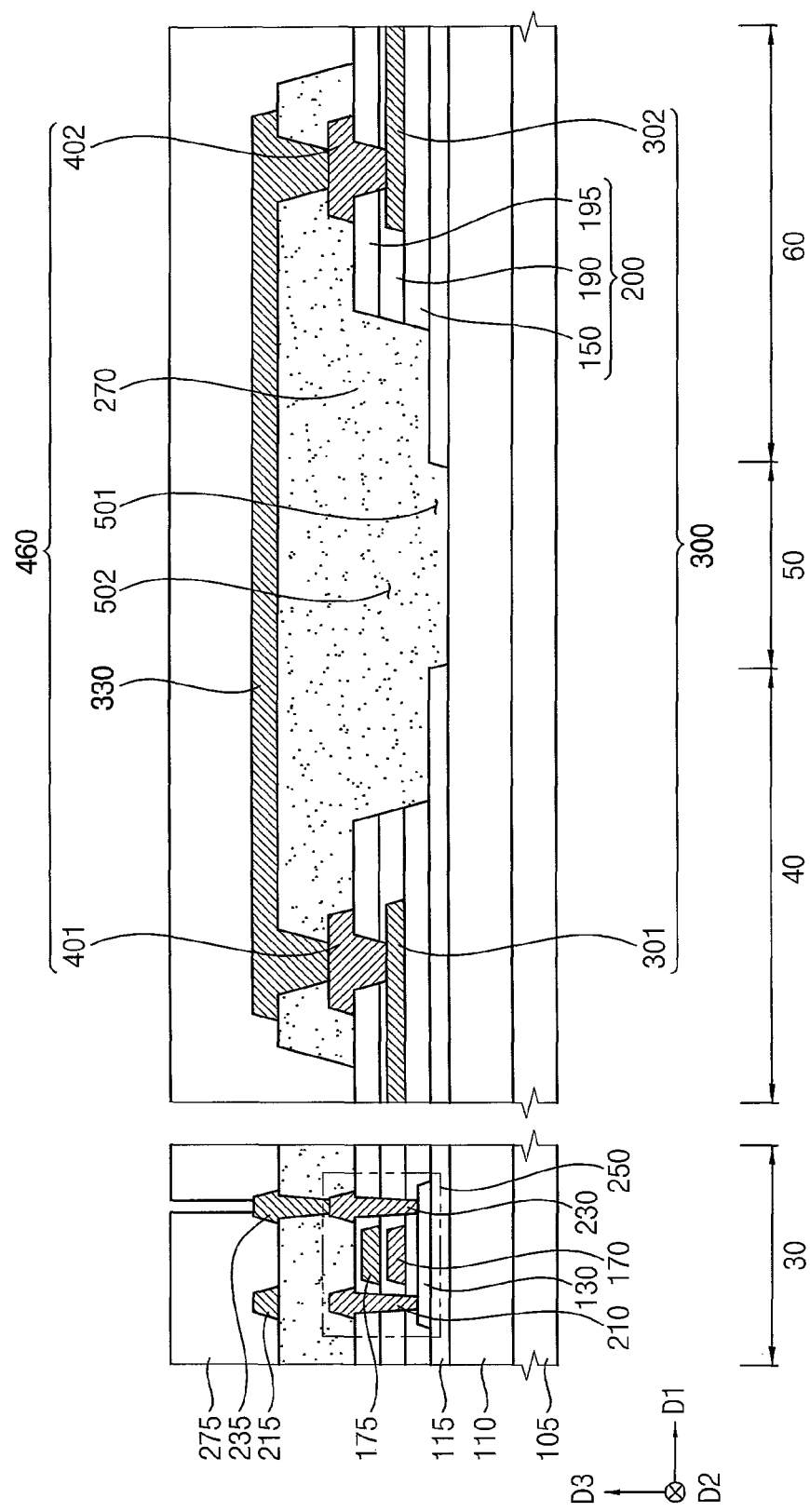

Referring to FIG. 17, a second planarization layer 275 may be formed on the wiring pattern 215, the connection pattern 235, the connection electrode 330, and the first planarization layer 270. The second planarization layer 275 may cover at least a portion of the wiring pattern 215 and the connection pattern 235 in the pixel region 30 on the first planarization layer 270 and extend substantially in the first direction D1, and may cover at least a portion of the connection electrode 330 in the first peripheral region 40, the bending region 50, and the second peripheral region 60. For example, a preliminary second planarization layer may be formed on the entire first planarization layer 270, and then the second planarization layer 275 may be formed by selectively performing a ninth etching process in the preliminary second planarization layer. Here, a contact hole exposing a portion of the connection pattern 235 may be formed in the second planarization layer 275 through the ninth etching process. The second planarization layer 275 may be formed relatively thickly to cover at least a portion of the wiring pattern 215, the connection pattern 235, and the connection electrode 330. In this case, the second planarization layer 275 may have a substantially flat upper surface, and a planarization process may be further performed on the second planarization layer 275 to implement the flat upper surface of the second planarization layer 275. Alternatively, the second planarization layer 275 may cover at least a portion of the wiring pattern 215, the connection pattern 235, and the connection electrode 330, and may be formed as a substantially uniform thickness along a profile of the wiring pattern 215, the connection pattern 235, and the connection electrode 330. The second planarization layer 275 may include organic materials and/or inorganic materials. According to exemplary embodiments of the present invention, the second planarization layer 275 may be formed using organic materials.

Figure 18:
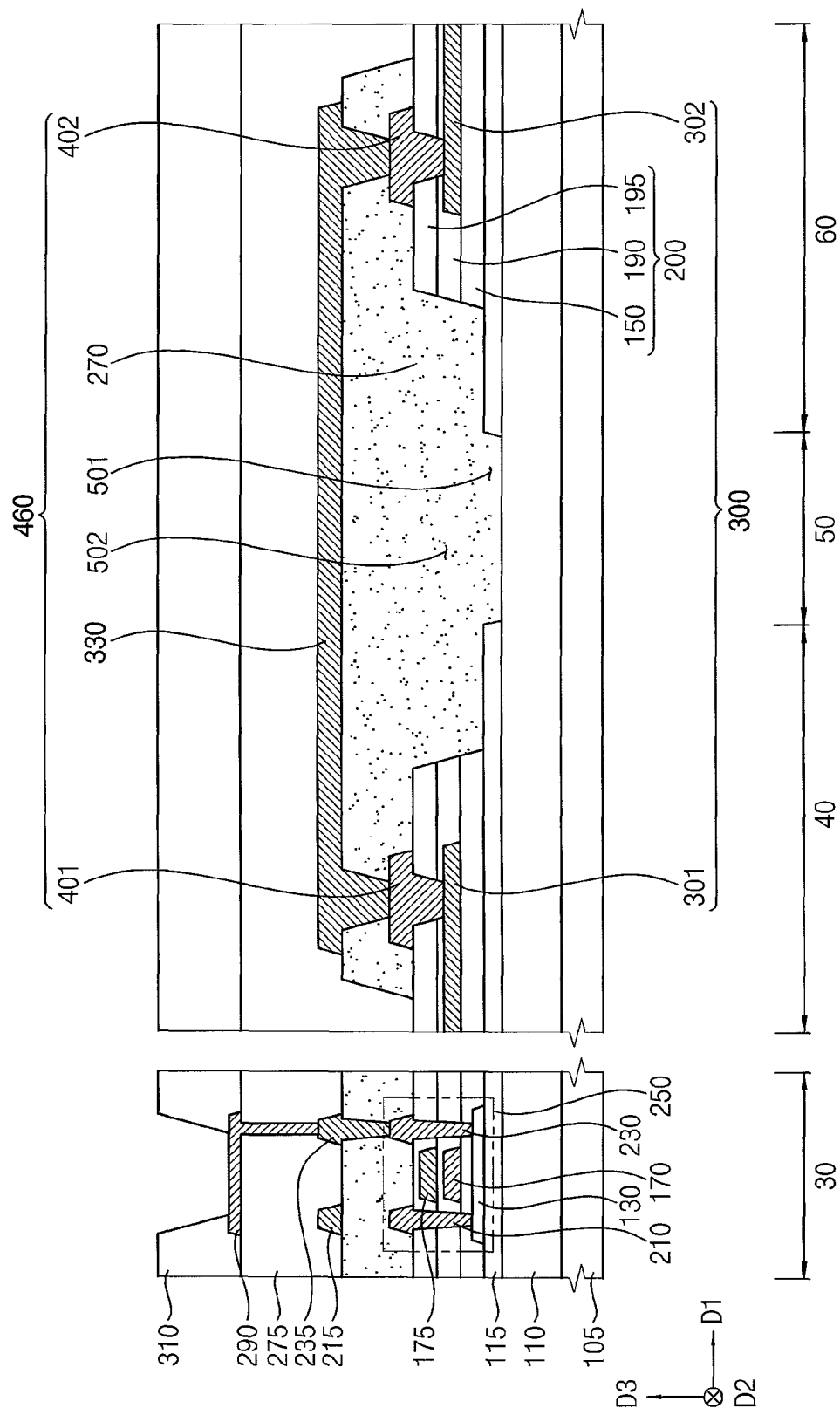

Referring to FIG. 18, a lower electrode 290 may be formed in the pixel region 30 on the second planarization layer 275. The lower electrode 290 may be in contact with the drain electrode 230 via the contact hole of the second planarization layer 275, and may be electrically connected to the semiconductor element 250. For example, a preliminary fifth metal wiring may be formed on the entire second planarization layer 275, and then the lower electrode 290 may be formed by selectively performing a tenth etching process in the preliminary fifth metal wiring. The lower electrode 290 may be formed using a metal, a metal alloy, metal nitride, conductive metal oxide, transparent conductive materials, etc. These may be used alone or in a suitable combination thereof. In some exemplary embodiments of the present invention, the lower electrode 290 may have a multi-layered structure.

A pixel defining layer 310 may be formed in the pixel region 30 on the second planarization layer 275, and may expose a portion of the lower electrode 290. For example, the pixel defining layer 310 may cover at least a portion of both lateral portions of the lower electrode 290 and extend substantially in the first direction D1, and may be formed in the first peripheral region 40, the bending region 50, and the second peripheral region 60. For example, a preliminary pixel defining layer may be formed on the entire second planarization layer 275, and then the pixel defining layer 310 may be formed by selectively performing an eleventh etching process in the preliminary pixel defining layer. Here, an opening exposing a portion of the lower electrode 290 may be formed in the pixel defining layer 310 through the eleventh etching process. The pixel defining layer 310 may include organic materials and/or inorganic materials. According to exemplary embodiments of the present invention, the pixel defining layer 310 may include organic materials.

Figure 19:
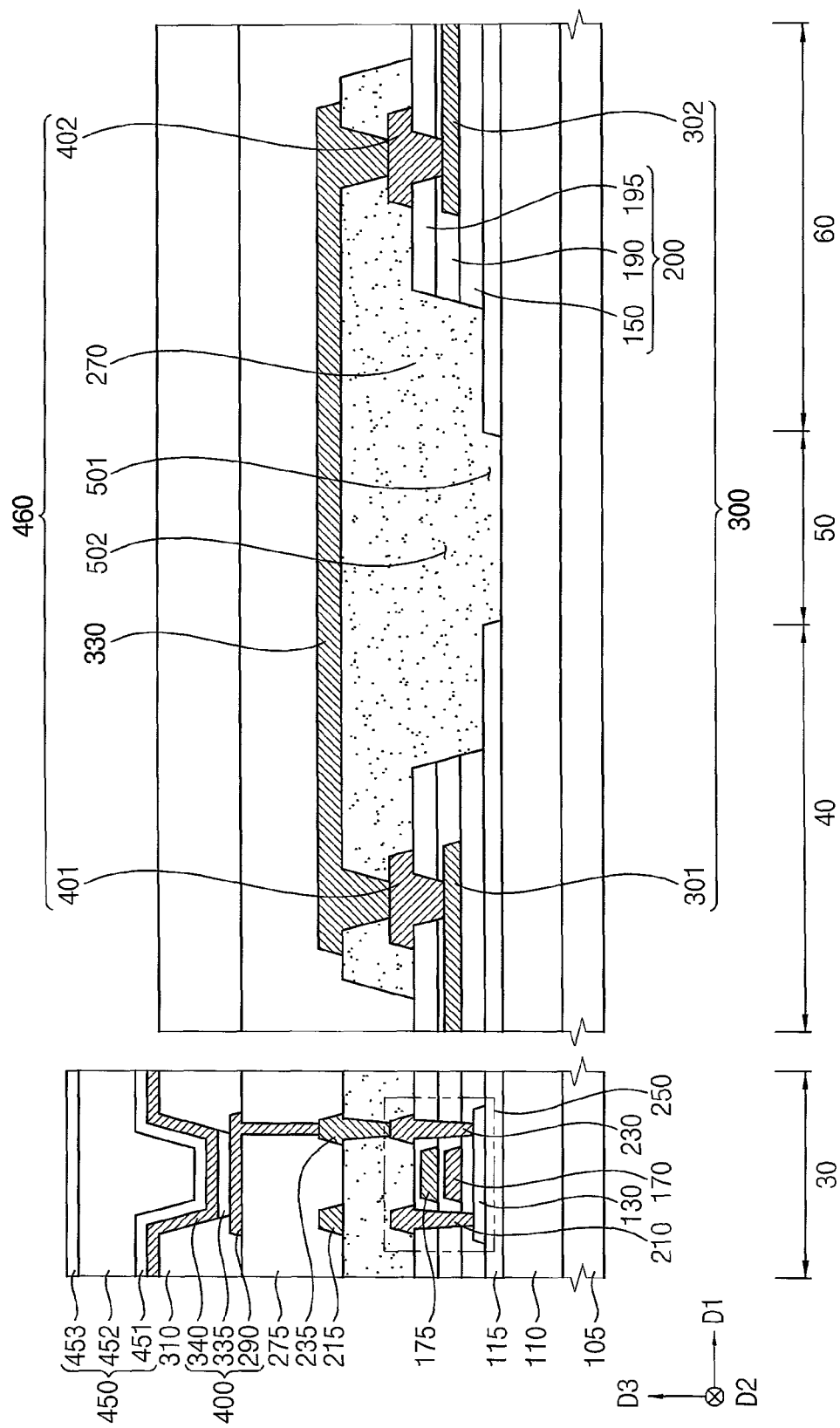

Referring to FIG. 19, a light emitting layer 335 may be formed in the opening of the pixel defining layer 310. The light emitting layer 335 may be formed using at least one of light emitting materials capable of generating different colors (e.g., red light, blue light, and green light, etc.) according to sub-pixels. Alternatively, the light emitting layer 335 may generally generate white light by stacking a plurality of light emitting materials capable of generating different colors such as red light, green light, blue light, etc. In this case, a color filter may be formed on the light emitting layer 335. The color filter may include a red color filter, a green color filter, and/or a blue color filter. Alternatively, the color filter may include a yellow color filter, a cyan color filter, and a magenta color filter. The color filter may be formed using a photosensitive resin (or color photoresist), etc.

An upper electrode 340 may be formed in the pixel region 30 on the pixel defining layer 310 and the light emitting layer 335. The upper electrode 340 may be formed a metal, a metal alloy, metal nitride, conductive metal oxide, transparent conductive materials, etc. These may be used alone or in a suitable combination thereof. In some exemplary embodiments of the present invention, the upper electrode 340 may have a multi-layered structure. Accordingly, a pixel structure 400 including the lower electrode 290, the light emitting layer 335, and the upper electrode 340 may be formed.

A first thin film encapsulation (TFE) layer 451 may be formed in the pixel region 30 on the upper electrode 340. The first TFE layer 451 may cover at least a portion of the upper electrode 340, and may be formed as a substantially uniform thickness along a profile of the upper electrode 340. The first TFE layer 451 may prevent the pixel structure 400 from being deteriorated by the permeation of moisture, water, oxygen, etc. In addition, the first TFE layer 451 may protect the pixel structure 400 from external impact. The first TFE layer 451 may be formed using inorganic materials.

A second TFE layer 452 may be formed on the first TFE layer 451. The second TFE layer 452 may increase the flatness of an OLED device, and may protect the pixel structure 400. The second TFE layer 452 may be formed using organic materials.

A third TFE layer 453 may be formed on the second TFE layer 452. The third TFE layer 453 may cover at least a portion of the second TFE layer 452, and may be formed as a substantially uniform thickness along a profile of the second TFE layer 452. The third TFE layer 453, together with the first TFE layer 451 and the second TFE layer 452, may prevent the pixel structure 400 from being deteriorated by the permeation of moisture, water, oxygen, etc. In addition, the third TFE layer 453, together with the first TFE layer 451 and the second TFE layer 452, may protect the pixel structure 400 from external impact. The third TFE layer 453 may be formed using inorganic materials. Accordingly, a TFE structure 450 including the first TFE layer 451, the second TFE layer 452, and the third TFE layer 453 may be formed. Alternatively, the TFE structure 450 may have a five-layer structure where first to fifth TFE layers are stacked or a seven-layer-structure where the first to seventh TFE layers are stacked. After the TFE structure 450 is formed, the rigid glass substrate may be separated form the substrate 110.

Accordingly, an OLED device 100 illustrated in FIG. 3 may be manufactured. As described above, the OLED device 100 may be manufactured through 11th mask processes (e.g., first through eleventh etching processes). Since the OLED device 100 is manufactured through a mask process having a reduced number of steps, a manufacturing cost of the OLED device 100 may be reduced.

Figure 20:
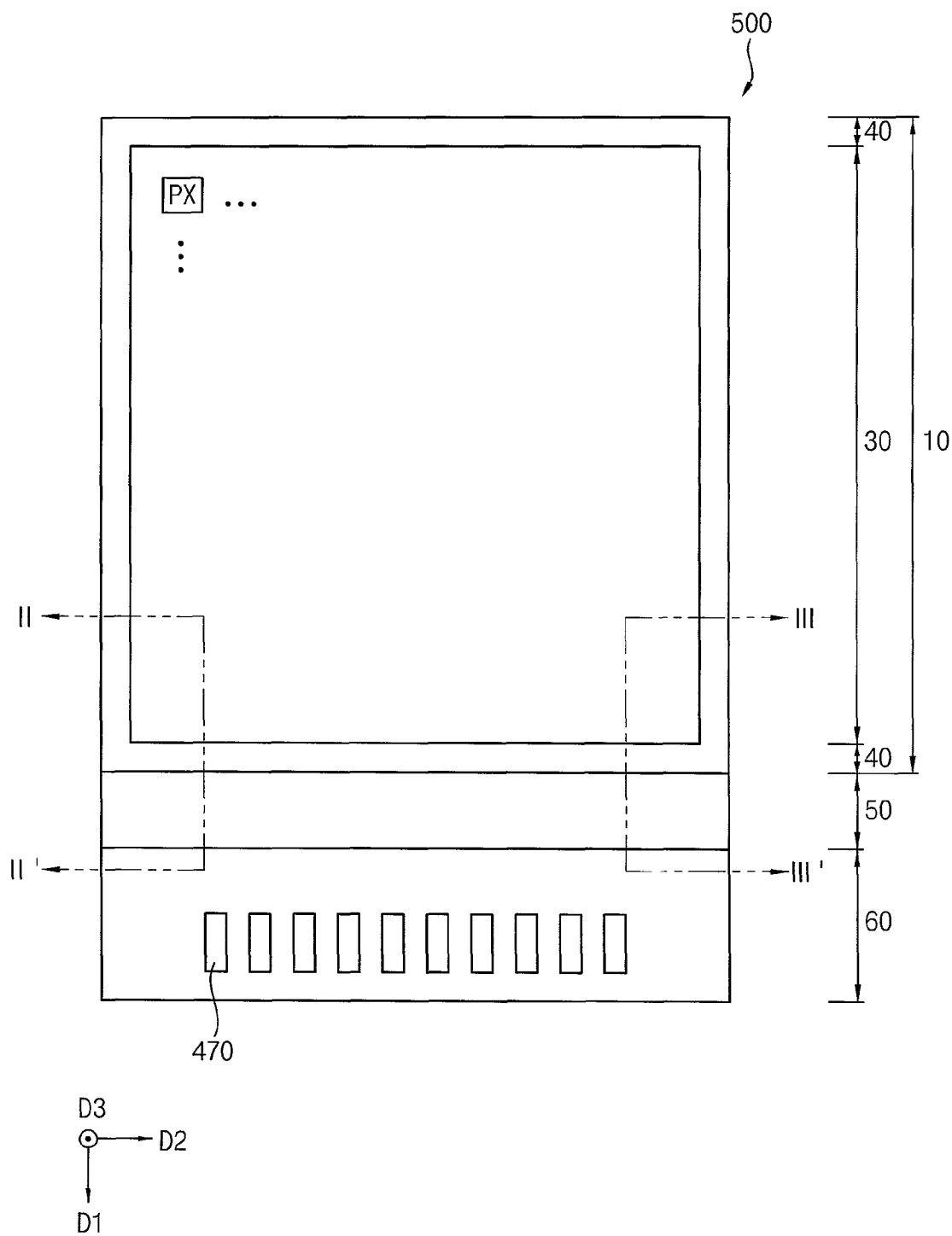
FIG. 20 is a plan view illustrating an OLED device in accordance with exemplary embodiments of the present invention.
Figure 21:
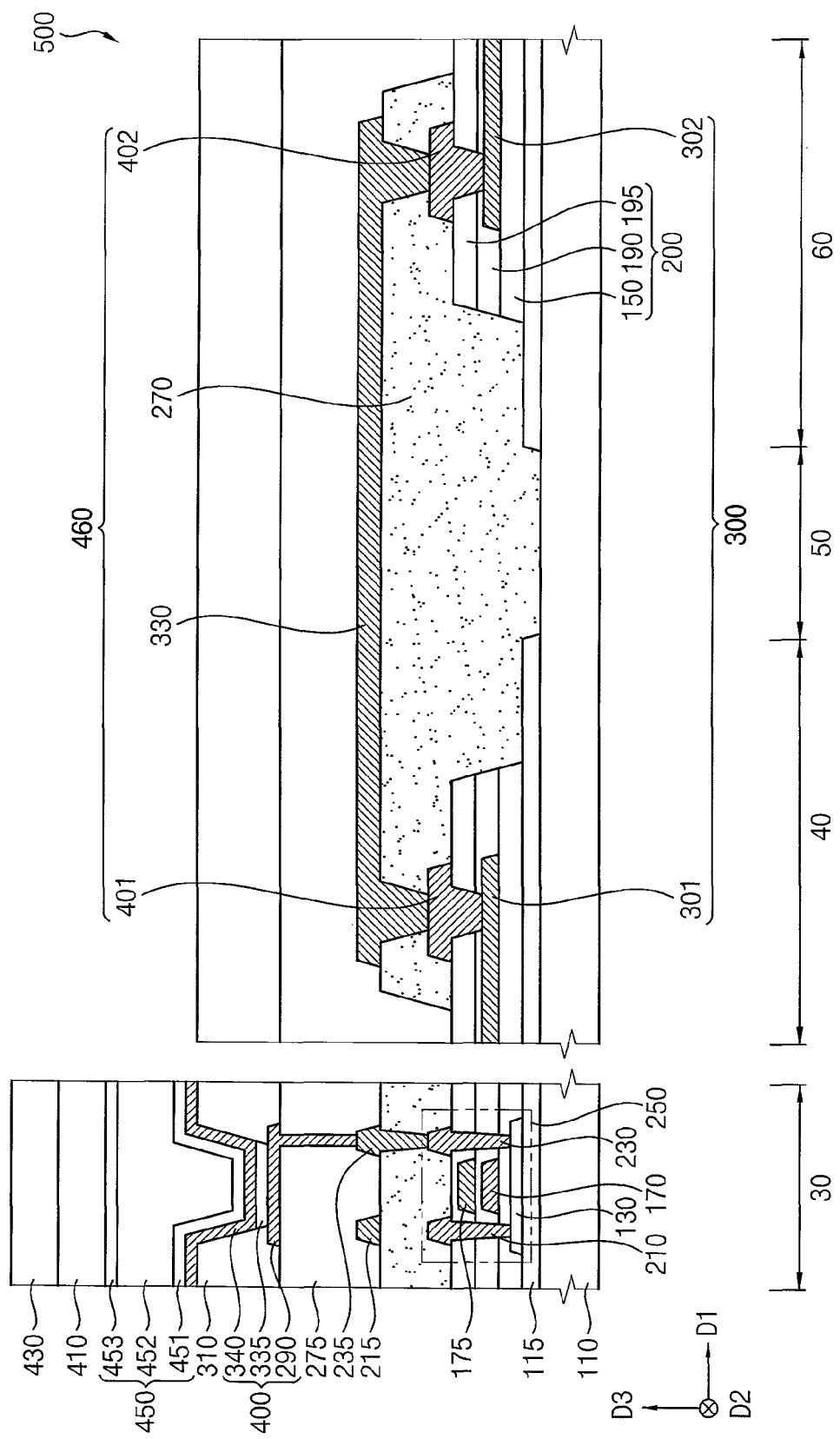
FIG. 21 is a cross-sectional view taken along a line II-II' of FIG. 20.
Figure 22:
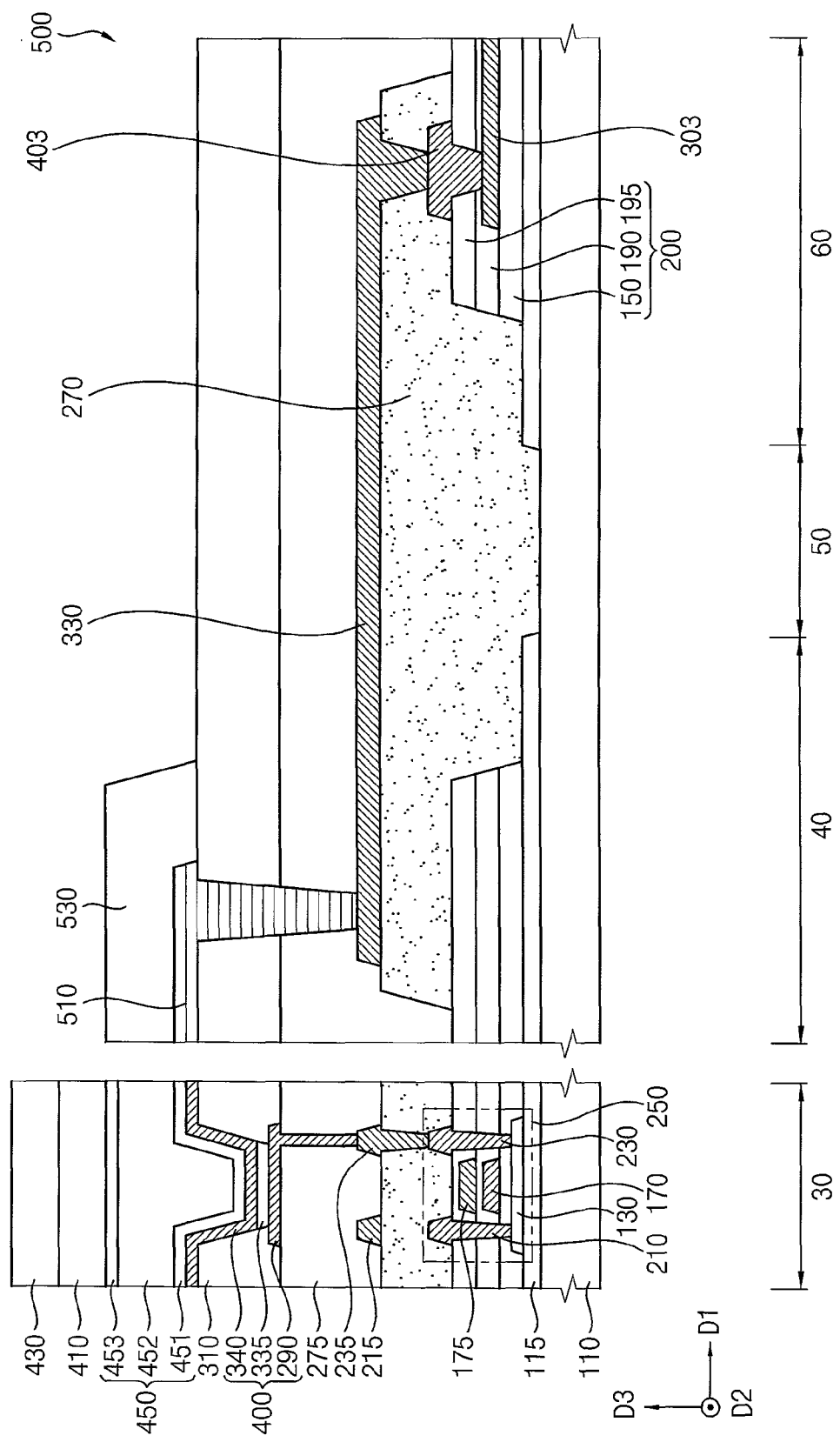
FIG. 22 is a cross-sectional view taken along a line III-III' of FIG. 20.

FIG. 20 is a plan view illustrating an OLED device in accordance with exemplary embodiments of the present invention, and FIG. 21 is a cross-sectional view taken along a line II-II' of FIG. 20. FIG. 22 is a cross-sectional view taken along a line of FIG. 20.

An OLED device 500 illustrated in FIGS. 20, 21, and 22 may have a configuration substantially the same as or similar to that of an OLED device 100 described with reference to FIGS. 1, 2, 3, 4, and 5 except for a touch screen electrode layer 410, a polarizing layer 430, a touch screen wiring 510, a protective insulating layer 530. In FIGS. 20, 21, and 22, detailed descriptions for elements that are substantially the same as or similar to elements described with reference to FIGS. 1, 2, 3, 4, and 5 might not be repeated.

Referring to FIG. 20, an OLED device 500 may have a display region 10, a bending region 50, and a second peripheral region 60. A plurality of pixels PX may be disposed in the display region 10, and the second peripheral region 60 may be spaced apart from the display region 10. Pad electrodes 470 that are electrically connected to an external device may be disposed in the second peripheral region 60. In addition, the bending region 50 may be interposed between the display region 10 and the second peripheral region 60.

The display region 10 may include a pixel region 30 where a light is emitted and a first peripheral region 40 surrounding the pixel region 30. According to exemplary embodiments of the present invention, the pixels PX (e.g., a pixel structure) emitting a light may be disposed in the pixel region 30, and a plurality of wirings may be disposed in the first peripheral region 40. The wirings may electrically connect the pad electrodes 470 and the pixels PX. For example, the wirings may include data signal wirings, scan signal wirings, light emission signal wirings, power supply voltage wirings, touch screen wirings, etc. In addition, a scan driver, a data driver, etc. may be disposed in the first peripheral region 40. Further, a portion of the first peripheral region 40 may be interposed between the pixel region 30 and the bending region 50.

As the bending region 50 is bent on an axis with respect to the second direction D2, the second peripheral region 60 may be disposed on a lower surface of the OLED device 100. For example, when the second peripheral region 60 is disposed on the lower surface of the OLED device 100, the bending region 50 may have a round shape (or a bended shape).

According to exemplary embodiments of the present invention, the OLED device 500 may include first through (N)th connection electrodes disposed in the bending region 50, where N is an integer greater than 1. In addition, the first through (N)th connection electrodes may be spaced apart from each other by a predetermined distance along a second direction D2 that is perpendicular to a first direction D1 from the pixel region 30 into the second peripheral region 60. The connection electrodes may be disposed to overlap the bending region 50, and may electrically connect the wiring and the pad electrodes 470. The pixels PX that are disposed in the pixel region 30 may be electrically connected to the external device that is electrically connected to the pad electrodes 470 through the connection electrodes that are disposed in the bending region 50 and the plurality of wirings that are disposed in the first peripheral region 40. For example, the external device may be electrically connected to the OLED device 500 through a FPCB. The external device 101 may provide a data signal, a scan signal, a light emission signal, a power supply voltage, a touch screen driving signal, etc. to the OLED device 500. In addition, a driving integrated circuit may be mounted in the FPCB. In some exemplary embodiments of the present invention, the driving integrated circuit may be mounted in the OLED device 500 that is disposed adjacent to the pad electrodes 470.

Referring to FIGS. 21 and 22, an OLED device 500 may include a substrate 110, a buffer layer 115, an insulation layer structure 200, a semiconductor element 250, a pixel structure 400, a fan-out wiring 300, a conductive pattern 460, a first planarization layer 270, a second planarization layer 275, a first connection electrode 330, a second connection electrode 333, a wiring pattern 215, a connection pattern 235, a pixel defining layer 310, a TFE structure 450, a touch screen electrode layer 410, a polarizing layer 430, a touch screen wiring 510, a protective insulating layer 530, etc. Here, the substrate 110 may have a pixel region 30, a first peripheral region 40 (e.g., the first peripheral region 40 disposed between the pixel region 30 and a bending region 50), a bending region 50, and a second peripheral region 60 (refer to FIG. 1). The insulation layer structure 200 may include a first gate insulation layer 150, a second gate insulation layer 190, and an insulating interlayer 195, and the semiconductor element 250 may include an active layer 130, a first gate electrode 170, a second gate electrode 175, a source electrode 210, and a drain electrode 230. In addition, the conductive pattern 460 may include a first conductive pattern 401, a second conductive pattern 402, and a third conductive pattern 403, and the fan-out wiring 300 may include a first fan-out wiring 301, a second fan-out wiring 302, and a third fan-out wiring 303. Further, the pixel structure 400 may include a lower electrode 290, a light emitting layer 335, and an upper electrode 340, and the TFE structure 450 may include a first TFE layer 451, a second TFE layer 452, and a third TFE layer 453.

The touch screen electrode layer 410 may be disposed on the TFE structure 450. The touch screen electrode layer 410 may include a bottom polyethylene terephthalate (PET) film, touch screen electrodes, and a top PET film, etc. The bottom PET film and/or the top PET film may protect the touch screen electrodes. For example, the top PET film and the bottom PET film may include polyethylene terephthalate (PET), polyethylene naphthalate (PEN), polypropylene (PP), polycarbonate (PC), polystyrene (PS), polysulfone (PSul), polyethylene (PE), polyphthalamide (PPA), polyethersulfone (PES), polyarylate (PAR), polycarbonate oxide (PCO), modified polyphenylene oxide (MPPO), and/ or etc. The touch screen electrodes may substantially have a metal mesh structure. For example, the touch screen electrodes may include carbon nanotube (CNT), transparent conductive oxide (TCO), ITO, indium gallium zinc oxide (IGZO), ZnOx, graphene, silver nanowire (AgNW), Cu, Cr, etc. Alternatively, the touch screen electrodes may be disposed directly on the TFE structure 450. In this case, the bottom PET film might not be disposed on the TFE structure 450. In some exemplary embodiments of the present disclosure, the polarizing layer 430 may be disposed on the TFE structure 450, and the touch screen electrode layer 410 may be disposed on the polarizing layer 430.

The polarizing layer 430 may be disposed on the touch screen electrode layer 410. The polarizing layer 430 may include a linearly polarized film and a λ/4 phase retardation film. Here, the λ/4 phase retardation film may be disposed on the touch screen electrode layer 410. The λ/4 phase retardation film may convert a phase of a light. For example, the λ/4 phase retardation film may convert the light vibrating up and down or the light vibrating left and right into right-circularly polarized light or left-circularly polarized light, respectively. In addition, the λ/4 phase retardation film may convert the right-circularly polarized light or the left-circularly polarized light into the light vibrating up and down or the light vibrating left and right, respectively. The λ/4 phase retardation film may include a birefringent film containing polymer, an orientation film of a liquid crystal polymer, alignment layer of a liquid crystal polymer, etc.

The linearly polarized film may be disposed on the λ/4 phase retardation film. The linearly polarized film may selectively transmit an incident light therethrough. For example, the linearly polarized film may transmit the light vibrating up and down or vibrating left and right. In this case, the linearly polarized film may include a pattern of horizontal stripes or vertical stripes. When the linearly polarized film includes a pattern of horizontal stripes, the linearly polarized film may block the light vibrating up and down, and may transmit the light vibrating left and right. When the linearly polarized film includes a pattern of vertical stripes, the linearly polarized film may block the light vibrating left and right, and may transmit the light vibrating up and down. The light transmitting the linearly polarized film may transmit the λ/4 phase retardation film. As described above, the λ/4 phase retardation film may convert a phase of the light. For example, when the incident light vibrating up, down, left, and right passes through the linearly polarized film, the linearly polarized film including a pattern of the horizontal stripes may transmit the light vibrating left and right. When the incident light vibrating left and right passes through the λ/4 phase retardation film, the incident light vibrating left and right may be converted into the left-circularly polarized light. The incident light including the left-circularly polarized light may be reflected at the cathode electrode (e.g., the upper electrode 340) of the display panel 200, and then the incident light may be converted into the right-circularly polarized light. When the incident light including the right-circularly polarized light passes through the λ/4 phase retardation film, the incident light may be converted into the light vibrating up and down. Here, the light vibrating up and down may be blocked by the linearly polarized film including a pattern of the horizontal stripes. Accordingly, the incident light may be removed by the linearly polarized film and the λ/4 phase retardation film (i.e., the polarizing layer 430). For example, the linearly polarized film may include iodine-based materials, materials containing dye, polyene-based materials, etc.

The plurality of connection electrodes may include first connection electrode 330 and the second connection electrode 333. For example, a portion of the plurality of connection electrodes may have a shape of the first connection electrode 330, and a remaining portion of the plurality of connection electrodes may have a shape of the second connection electrode 333.

As illustrated in FIG. 21, the external device may provide data signals, scan signals, light emission signals, power supply voltage, etc. to the first connection electrode 330, and the signals may be applied to the pixel structure 400 through the first connection electrode 330.

As illustrated in FIG. 22, the third fan-out wiring 303 may extend substantially along the first direction D1 in the second peripheral region 60 on the first gate insulation layer 150, and may be electrically connected to the external device. The third fan-out wiring 303, the first fan-out wiring 301, and the second fan-out wiring 302 may be disposed at the same level, and may be simultaneously formed using the same materials.

The second connection electrode 333 may be disposed on a portion of the first peripheral region 40, the bending region 50, and a portion of the second peripheral region 60 on the first planarization layer 270, and may be electrically connected to the third conductive pattern 403. The second connection electrode 333 and the first connection electrode 330 may be simultaneously formed using the same materials.

The touch screen wiring 510 may extend substantially along the first direction D1 in the first peripheral region 40 on the pixel defining layer 310, and the may electrically connect the touch screen electrode layer 410 and the second connection electrode 333. The touch screen wiring 510 may include a metal, an alloy of a metal, metal nitride, conductive metal oxide, transparent conductive materials, etc.

The protective insulating layer 530 may be disposed on the touch screen wiring 510 to protect the touch screen wiring 510. The protective insulating layer 530 may include organic materials and/or inorganic materials.

The third fan-out wiring 303 may receive touch screen driving signals, etc. from the external device, and the signals applied to the third fan-out wiring 303 may be provided to the touch screen electrode layer 410 through the third conductive pattern 403, the second connection electrode 333, and the touch screen wiring 510. In this case, the first fan-out wiring 301 and the first conductive pattern 401 might not be disposed.

As the OLED device 500, in accordance with exemplary embodiments of the present invention, includes second connection electrode 333, the touch screen wiring 510, and the protective insulating layer 530, the OLED device 500 may provide the touch screen driving signals to the touch screen electrode layer 410 by using the second connection electrode 333.

Figure 23:
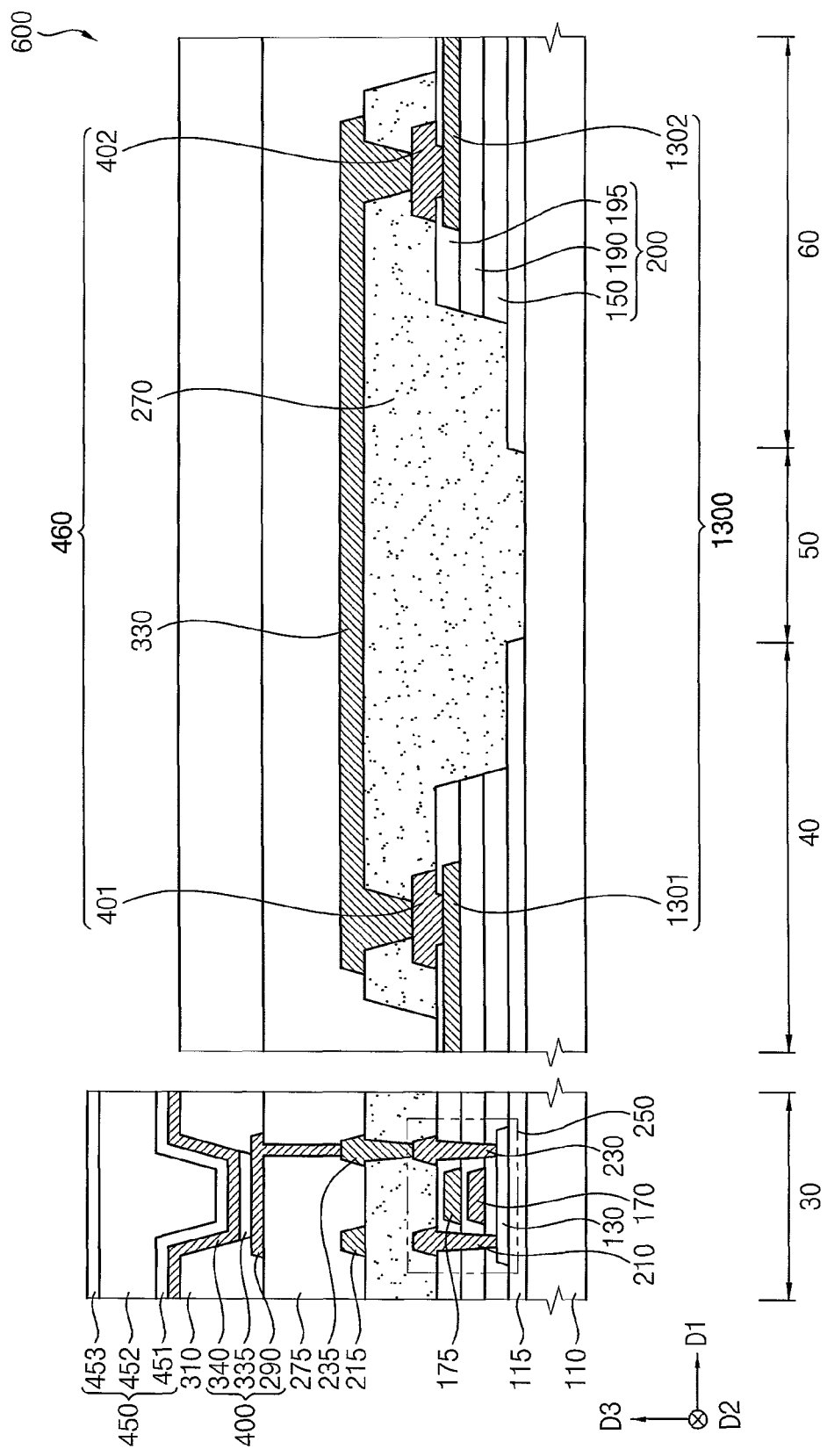
FIG. 23 is a cross-sectional view illustrating an OLED device in accordance with exemplary embodiments of the present invention.

FIG. 23 is a cross-sectional view illustrating an OLED device in accordance with exemplary embodiments of the present invention. An OLED device 600 illustrated in FIG. 23 may have a configuration substantially the same as or similar to that of an OLED device 100 described with reference to FIGS. 1, 2, 3, 4, and 5 except for a pan-out wiring 1300. In FIG. 23, detailed descriptions for elements that are substantially the same as or similar to elements described with reference to FIGS. 1, 2, 3, 4, and 5 might not be repeated.

Referring to FIG. 23, the fan-out wiring 1300 may include a first fan-out wiring 1301 and a second fan-out wiring 1302. The first fan-out wiring 1301 may extend substantially along a first direction D1 in a first peripheral region 40 on a second gate insulation layer 190, and may be electrically connected to a pixel structure 400 disposed in a pixel region 30. In addition, the second fan-out wiring 1302 may extend substantially along a second direction D2 in a second peripheral region 60 on the second gate insulation layer 190, and may be electrically connected to an external device 101 through pad electrodes 470 disposed in the second peripheral region 60 (refer FIG. 1).

Figure 24:
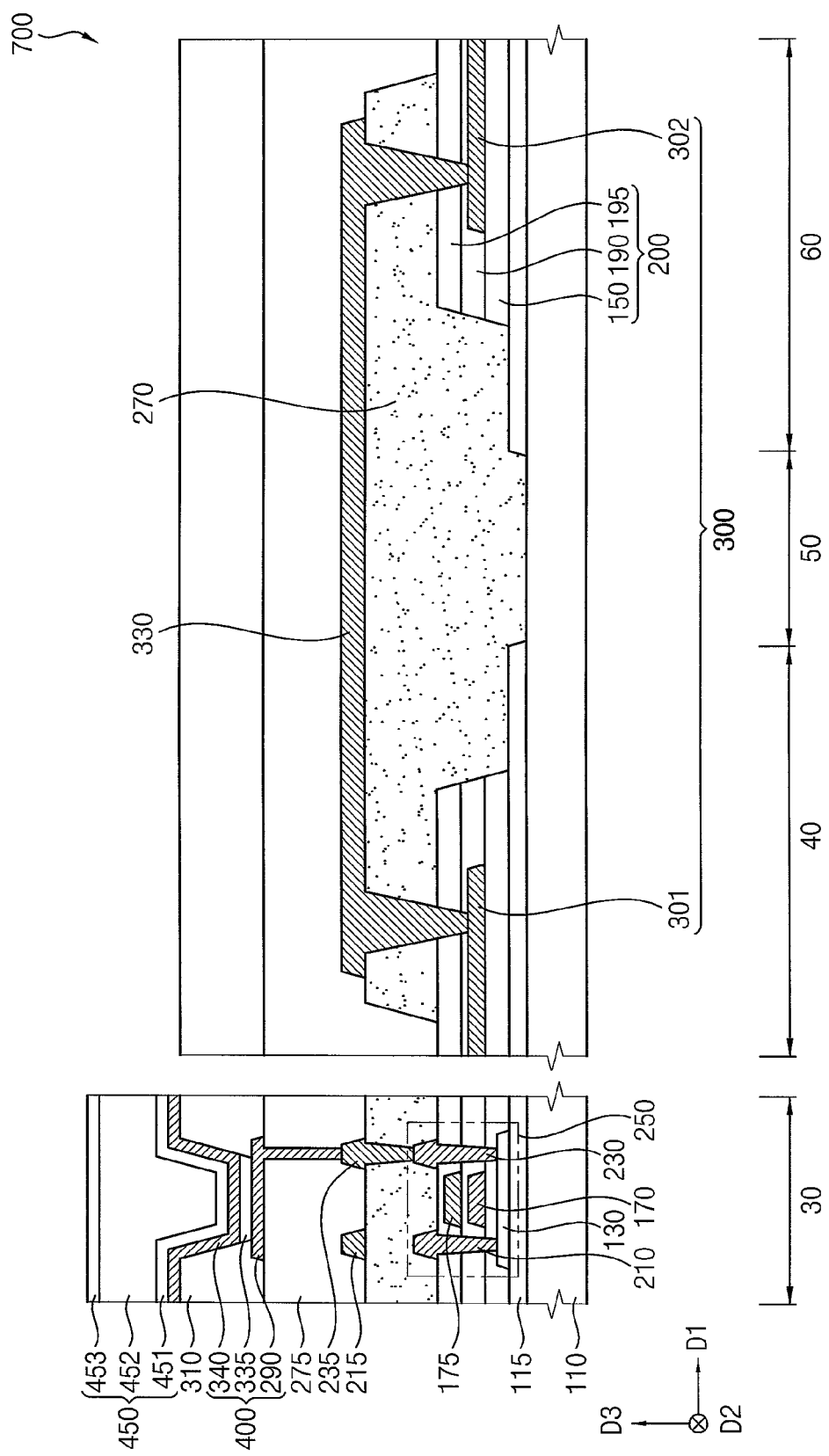
FIG. 24 is a cross-sectional view illustrating an OLED device in accordance with exemplary, embodiments of the present invention.

FIG. 24 is a cross-sectional view illustrating an OLED device in accordance with exemplary embodiments of the present invention. An OLED device 700 illustrated in FIG. 24 may have a configuration substantially the same as or similar to that of an OLED device 100 described with reference to FIGS. 1, 2, 3, 4, and 5. In FIG. 23, detailed descriptions for elements that are substantially the same as or similar to elements described with reference to FIGS. 1, 2, 3, 4, and 5 might not be repeated.

Referring to FIG. 24, a connection electrode 330 may be disposed in a portion of a first peripheral region 40, a bending region 50, and a portion of a second peripheral region 60 on the first planarization layer 270. The connection electrode 330 may be in direct contact with the fan-out wiring 300. For example, the first planarization layer 270 and a insulation layer structure 200 may include a first contact hole disposed in the first peripheral region 40 and a second contact hole disposed in the second peripheral region 60, and the connection electrode 330 may be in direct contact with a first fan-out wiring 301 in the first peripheral region 40 via the first contact hole, and may be direct contact with a second fan-out wiring 302 in the second peripheral region 60 via the second contact hole. As the connection electrode 330 electrically connects the first fan-out wiring 301 and the second fan-out wiring 302, scan signals, data signals, light emission signals, initialization signals, power supply voltage, etc. provided form the external device 101 may be applied to a pixel structure 400. According to exemplary embodiments of the present invention, the connection electrode 330, a wiring pattern 215, and a connection pattern 235 may be simultaneously formed using the same materials. The connection electrode 330 may include a metal, an alloy of a metal, metal nitride, conductive metal oxide, transparent conductive materials, etc. These are used alone or in a suitable combination thereof. In some exemplary embodiments of the present disclosure, the connection electrode 330 may have a multi-layered structure.

In this case, the OLED device 700 might not include the conductive pattern 460. Accordingly, a manufacturing cost of the OLED device 700 may be relatively reduced.

Figure 25:
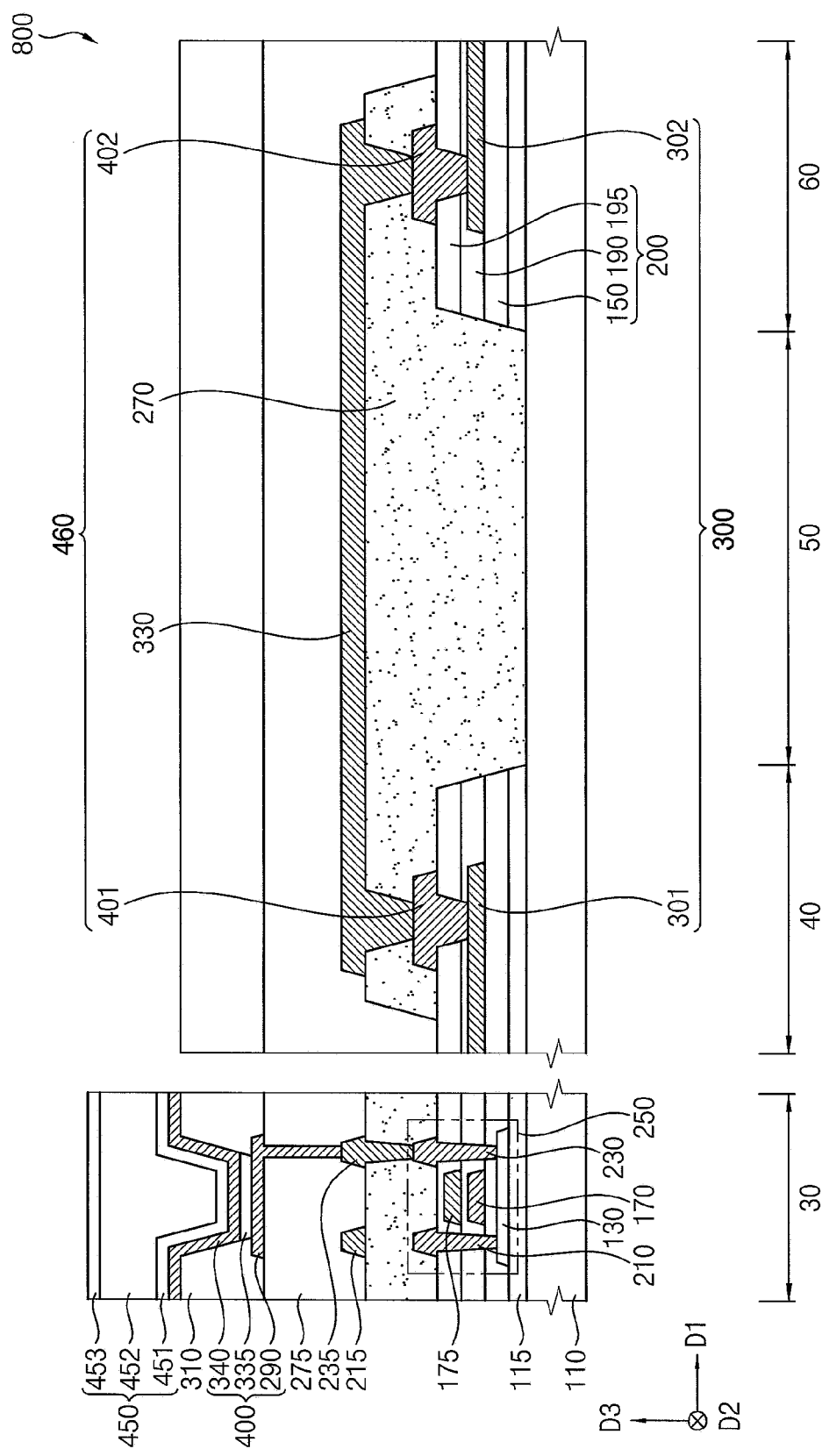
FIG. 25 is a cross-sectional view illustrating an OLED device in accordance with exemplary embodiments of the present invention.

FIG. 25 is a cross-sectional view illustrating an OLED device in accordance with exemplary embodiments of the present invention. An OLED device 800 illustrated in FIG. 25 may have a configuration substantially the same as or similar to that of an OLED device 100 described with reference to FIGS. 1, 2, 3, 4, and 5 except for a shape of insulation layers. In FIG. 25, detailed descriptions for elements that are substantially the same as or similar to elements described with reference to FIGS. 1, 2, 3, 4, and 5 might not be repeated.

Referring to FIG. 25, a buffer layer 115 may be disposed on a substrate 110. According to exemplary embodiments of the present invention, the buffer layer 115 may be entirely disposed in a pixel region 30 and a first peripheral region 40 on the substrate 110, and may expose an upper surface of the substrate 110 disposed in a bending region 50.

An insulation layer structure 200 may be disposed on the buffer layer 115. According to exemplary embodiments of the present invention, the insulation layer structure 200 may be entirely disposed in the pixel region 30 and the first peripheral region 40 on the substrate 110, and may expose the upper surface of the substrate 110 disposed in the bending region 50.

In this case, a distance in a first direction D1 of the bending region 50 may be increased. For example, the OLED device 800 may be used in a flexible display device having a radius of curvature of a relatively large bending region 50.

Exemplary embodiments of the present invention may be applied to various display devices including an OLED device. For example, exemplary embodiments of the present invention may be applied to vehicle-display device, a ship-display device, an aircraft-display device, portable communication devices, display devices for display or for information transfer, a medical-display device, etc.

Exemplary embodiments described herein are illustrative, and many variations can be introduced without departing from the spirit of the disclosure or from the scope of the appended claims. For example, elements and/or features of different exemplary embodiments may be combined with each other and/or substituted for each other within the scope of this disclosure and appended claims.

What is claimed is:

1. An organic light emitting display (OLED) device comprising:
   a substrate having a display region including a pixel region and a first peripheral region surrounding the pixel region, the substrate further includes a second peripheral region that is spaced apart from the display region, and a bending region that is interposed between the display region and the second peripheral region;
   a buffer layer disposed on the substrate, the buffer layer having a first opening exposing an upper surface of the substrate that is disposed in the bending region;
   a plurality of pixel structures disposed in the pixel region on the buffer layer;
   an insulation layer structure including a plurality of insulation layers disposed on the buffer layer, the insulation layer structure having a second opening exposing an upper surface of the substrate that is disposed in the bending region and a first portion of the buffer layer that is disposed adjacent to the bending region;
   a fan-out wiring disposed between two adjacent insulation layers of the plurality of insulation layers, the fan-out wiring being disposed in the first peripheral region, the second peripheral region, or in both the first peripheral region and the second peripheral region;
   a connection electrode disposed in the bending region on the substrate, the connection electrode being electrically connected to the fan-out wiring, the connection electrode electrically connecting the pixel structure and an external device; and
   a first planarization layer disposed in the first peripheral region disposed adjacent to the bending region, the bending region, and the second peripheral region disposed adjacent to the bending region on the substrate,
   wherein the second opening overlaps the first opening, and a size of the second opening is greater than a size of the first opening,
   wherein the fan-out wiring includes a first fan-out wiring disposed in the first peripheral region and a second fan-out wiring disposed in the second peripheral region, and wherein the insulation layer structure includes:
- a first gate insulation layer disposed in the first and second peripheral regions on the buffer layer;
- a second gate insulation layer disposed in the first and second peripheral regions on the first gate insulation layer; and
- an insulating interlayer covering at least a portion of the first fan-out wiring in the first peripheral region and the second fan-out wiring in the second peripheral region on the second gate insulation layer, the insulating interlayer exposing the upper surface of the substrate in the bending region.

2. The OLED device of claim 1, wherein the first fan-out wiring is electrically connected to the pixel structure, and the second fan-out wiring is electrically connected to the external device.

3. The OLED device of claim 2, further comprising: a conductive pattern disposed on the insulation layer structure, the conductive pattern being electrically connected to the fan-out wiring.

4. The OLED device of claim 3, wherein the insulation layer structure includes a first contact hole disposed in the first peripheral region and a second contact hole disposed in the second peripheral region, and wherein the conductive pattern includes a first conductive pattern disposed in the first peripheral region and a second conductive pattern disposed in the second peripheral region.

5. The OLED device of claim 3, wherein the first conductive pattern is electrically connected to the first fan-out wiring via the first contact hole, and the second conductive pattern is electrically connected to the second fan-out wiring via the second contact hole, and wherein the connection electrode is electrically connected to the first and second conductive patterns via third and fourth contact holes.

6. The OLED device of claim 5, further comprising:
- a semiconductor element interposed the buffer layer and the pixel structure, wherein the semiconductor element includes:
- an active layer disposed on the buffer layer;
- a first gate electrode disposed on the active layer;
- a second gate electrode disposed on the first gate electrode; and
- source and drain electrode disposed on the second gate electrode.

7. The OLED device of claim 6, wherein the first gate electrode and the fan-out wiring are disposed at a same level.

8. The OLED device of claim 6, wherein the second gate electrode and the fan-out wiring are disposed at a same level.

9. The OLED device of claim 6, wherein the conductive pattern and the source and drain electrodes are disposed at a same level.

10. The OLED device of claim 6, wherein the pixel structure includes: a lower electrode disposed on the semiconductor element; a light emitting layer disposed on the lower electrode; and an upper electrode disposed on the light emitting layer.

11. The OLED device of claim 1, further comprising: a thin film encapsulation structure disposed on the pixel structure, wherein the thin film encapsulation structure and the substrate include materials having a flexibility.

12. The OLED device of claim 11, further comprising: a touch screen electrode layer disposed on the thin film encapsulation structure; and a polarizing layer disposed on the touch screen electrode layer.

13. The OLED device of claim 12, wherein the connection electrode includes first through (N)th connection electrodes in the bending region, where N is an integer greater than 1, and wherein the first through (N)th connection electrodes are spaced apart from each other by a predetermined distance along a second direction that is perpendicular to a first direction extending from the pixel region into the second peripheral region.

14. The OLED device of claim 13, further comprising:
- a touch screen wiring electrically connected to the touch screen electrode layer and at least one among the first through (N)th connection electrodes; and
- a protective insulating layer covering at least a portion of the touch screen wiring.

15. The OLED device of claim 14, wherein the fan-out wiring further includes: a third fan-out wiring disposed in the second peripheral region on the substrate, wherein the touch screen wiring is electrically connected to the third fan-out wiring.

16. The OLED device of claim 11, further comprising: a polarizing layer disposed on the thin film encapsulation structure; and a touch screen electrode layer disposed on the polarizing layer.

* * * * *